(12) United States Patent
Ishikawa

(10) Patent No.: US 7,095,046 B2
(45) Date of Patent: Aug. 22, 2006

(54) SEMICONDUCTOR DEVICE

(75) Inventor: Akira Ishikawa, Kanagawa (JP)

(73) Assignee: Semiconductor Energy Laboratory Co., Ltd., (JP)

( * ) Notice: Subject to any disclaimer, the term of this patent is extended or adjusted under 35 U.S.C. 154(b) by 104 days.

(21) Appl. No.: 10/818,032

(22) Filed: Apr. 5, 2004

(65) Prior Publication Data
US 2004/0188692 A1    Sep. 30, 2004

Related U.S. Application Data

(63) Continuation of application No. 10/152,277, filed on May 21, 2002, now Pat. No. 6,734,463.

(30) Foreign Application Priority Data

May 23, 2001   (JP)   ............................. 2001-154673

(51) Int. Cl.
*H01L 29/04*   (2006.01)
*H01L 35/24*   (2006.01)
*H01L 29/49*   (2006.01)

(52) U.S. Cl. .................... 257/59; 257/40; 257/E29.117

(58) Field of Classification Search ...................... None
See application file for complete search history.

(56) References Cited

U.S. PATENT DOCUMENTS

| | | | |
|---|---|---|---|
| 5,742,365 A | 4/1998 | Seo | 349/43 |
| 5,966,193 A | 10/1999 | Zhang et al. | 349/110 |
| 5,986,729 A | 11/1999 | Yamanaka et al. | 349/79 |
| 5,986,738 A | 11/1999 | Tagusa et al. | 349/138 |
| 6,091,467 A | 7/2000 | Kubo et al. | 349/44 |
| 6,137,552 A | 10/2000 | Yanai | 349/44 |
| 6,166,792 A | 12/2000 | Miyawaki et al. | 349/113 |
| 6,327,006 B1 | 12/2001 | Sato et al. | 349/44 |
| 6,380,559 B1 | 4/2002 | Park et al. | 257/59 |
| 2001/0005020 A1 | 6/2001 | Jinno et al. | 257/59 |
| 2001/0046013 A1 | 11/2001 | Noritake et al. | 349/113 |
| 2002/0047120 A1* | 4/2002 | Inukai | 257/59 |
| 2002/0118322 A1 | 8/2002 | Murade | 349/110 |
| 2003/0206332 A1* | 11/2003 | Yamazaki et al. | 359/312 |

FOREIGN PATENT DOCUMENTS

| | | |
|---|---|---|
| JP | 2000-162647 | 6/2000 |
| JP | 2000-164875 | 6/2000 |
| JP | 2001-177100 | 6/2001 |

* cited by examiner

*Primary Examiner*—Zandra V. Smith
*Assistant Examiner*—Kiesha Rose
(74) *Attorney, Agent, or Firm*—Cook, Alex, McFarron, Manzo, Cummings & Mehler, Ltd.

(57) ABSTRACT

Provided is a method of realizing a semiconductor device having a structure in which a sufficient light shielding property is compatible with a sufficient storage capacitance without reducing an aperture ratio. A lower light shielding film is formed on a substrate, a TFT is formed on the lower light shielding film, and an upper light shielding film is formed on the TFT via an interlayer insulating film to cover and fit the TFT. Thus, the TFT can be completely light-shielded by the lower light shielding film and the upper light shielding film and an occurrence of a photo leak current can be prevented.

28 Claims, 16 Drawing Sheets

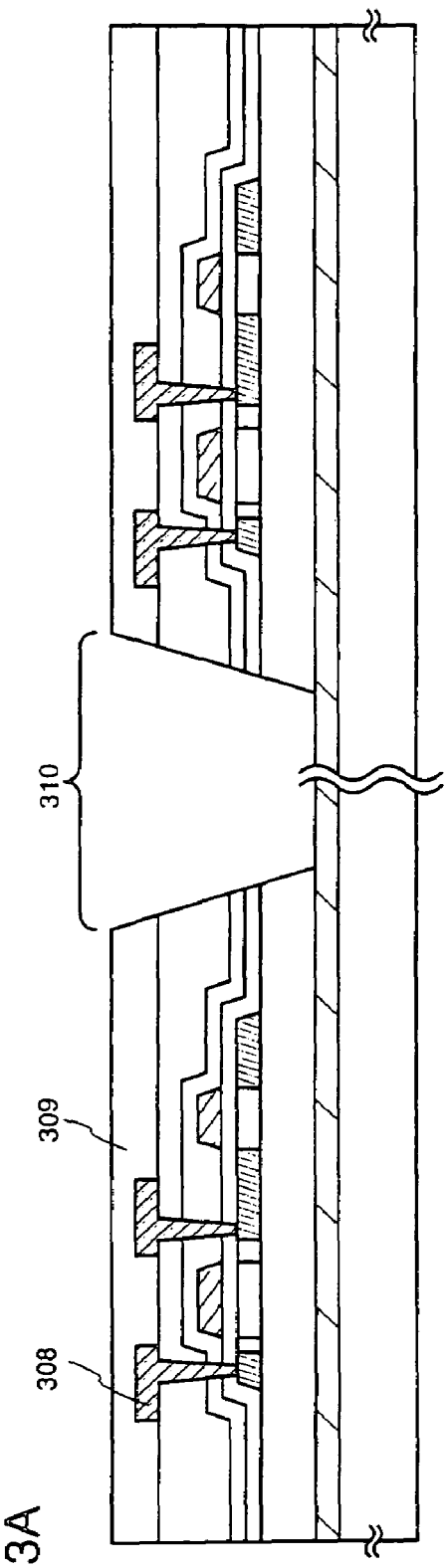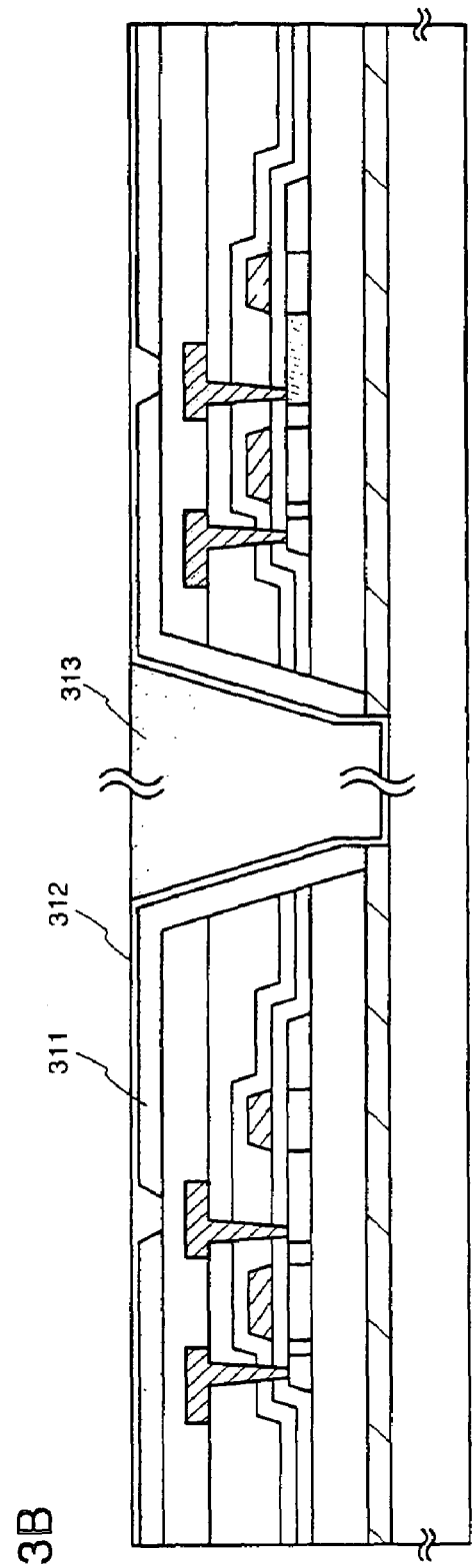

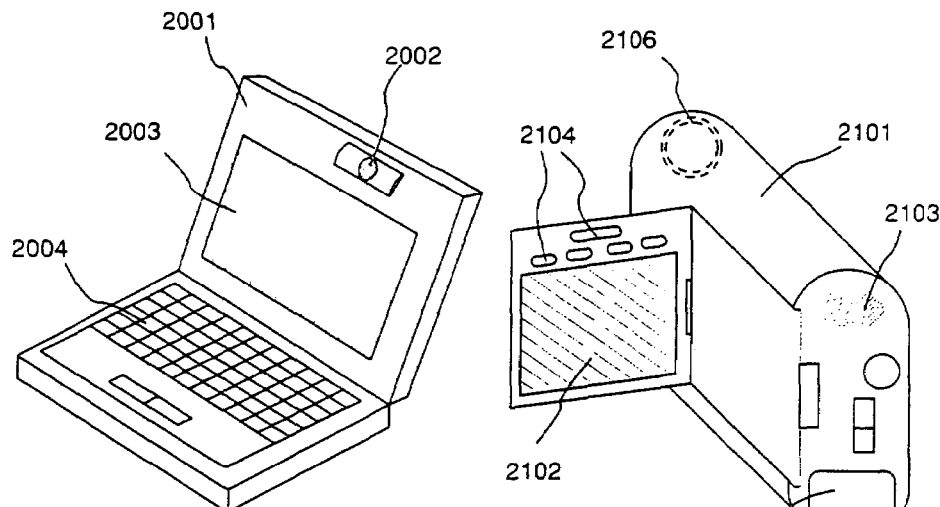
FIG. 11A
FIG. 11B
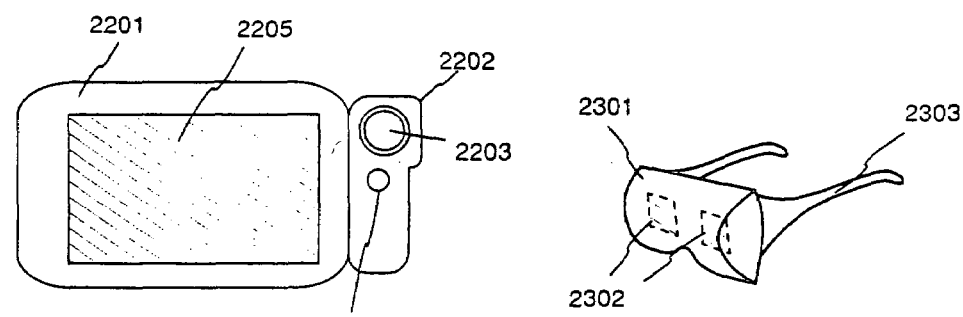
FIG. 11C
FIG. 11D
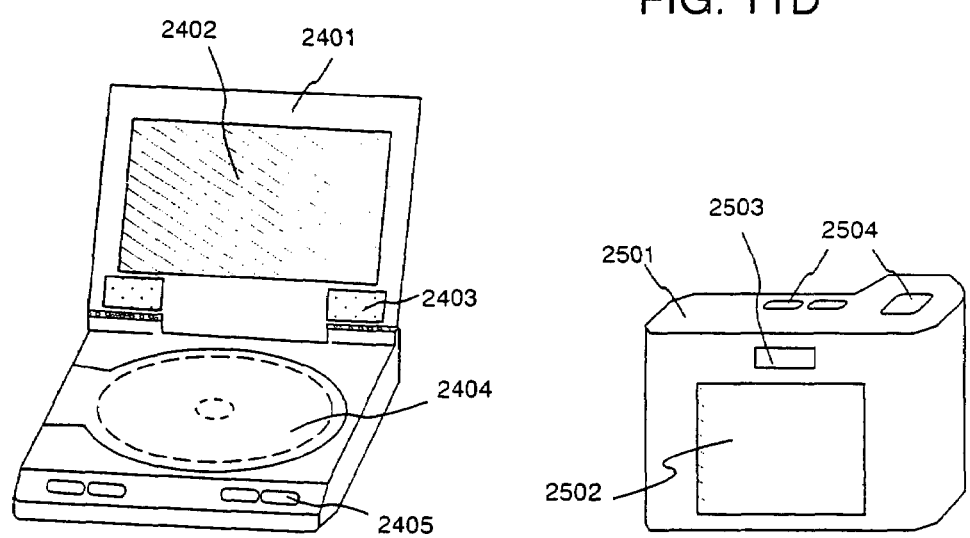
FIG. 11E
FIG. 11F

SEMICONDUCTOR DEVICE

This application is a continuation of U.S. application Ser. No. 10/152,227, filed on May 21, 2002 now U.S. Pat. No. 6,734,463.

BACKGROUND OF THE INVENTION

1. Field of the Invention

The present invention relates to a semiconductor element typically a thin film transistor (TFT), using particularly a crystalline semiconductor film as a semiconductor layer including a channel forming region, a source region, and a drain region. Also, the present invention relates to a semiconductor device using such a TFT as a driver circuit or a switching element of a pixel (particularly, a liquid crystal display device or a light emitting device) and a manufacturing technique thereof. Further, the present invention particularly relates to a semiconductor device having a structure in which a light shielding property is improved and a manufacturing technique thereof.

2. Description of the Related Art

In recent years, a liquid crystal projector in which characteristics such as miniaturization and weight reduction are improved has been used in various situations. In response to that, competition of development for providing a liquid crystal projector having a smaller size and lighter weight is intensified. The liquid crystal projector is constructed so as to project an image and the like displayed on a liquid crystal display device and the performance of the liquid crystal projector is greatly influenced by a display quality of the liquid crystal display device.

As to the liquid crystal display device, the mainstream is one in which liquid crystal is sealed between a substrate in which a TFT and a pixel electrode are formed (hereinafter referred to as a TFT substrate) and a substrate in which a counter electrode is formed (hereinafter referred to as a counter substrate) and an alignment of the liquid crystal is controlled by an electric field produced between the pixel electrode and the counter electrode to display an image.

In recent years, an active matrix type liquid crystal display device (liquid crystal panel) having several million pixels in a pixel portion is greatly used as a liquid crystal display device. In such a liquid crystal panel, a TFT is provided in each of pixels as a switching element for providing a potential to each of pixels and a pixel electrode is provided in each TFT. When the TFT is turned on, the potential of the pixel electrode is set. When the TFT is turned off, the potential of the pixel electrode is kept by charges stored in a storage capacitor element (hereinafter referred to as a storage capacitor).

When the potential of the pixel electrode is changed while the TFT is in an off state, a display quality is deteriorated. Thus, it is required for an active matrix type TFT substrate that a leak current of the TFT is suppressed, a sufficient storage capacitance is obtained for each of pixels, and the amount of charges stored in the storage capacitor is sufficiently larger than that lost by a leak current.

Also, in the case of a transmission type liquid crystal panel, in order to increase the intensity, it is necessary to increase an occupying ratio of an opening portion, that is, a region which is intended to control display in a pixel (for example, a region through which light is transmitted and which contributes to display in the case of a transmission type display device, a region from which light is reflected and which contributes to display in the case of a reflection type display device, a region in which an organic light emitting layer sandwiched by electrodes emits light and which contributes to display in the case of a display device using an organic light emitting element, or the like).

Incidentally, in the case where the above-mentioned liquid crystal panel (in particular, a transmission type liquid crystal panel) is used for a liquid crystal projector, when light is incident into the semiconductor layer of a TFT, since a leak current due to photo-excitation (hereinafter referred to as a photo leak current) is caused, it has an adverse affect on display. Thus, a light shielding layer is provided in the liquid crystal panel. For example, when a light source of the projector is located in a counter substrate side, the light shielding layer is formed between a pixel electrode and a TFT to block light from the light source, or the light shielding layer is formed between a substrate and a semiconductor layer to block light reflected from a projection lens or the like. Also, according to Japanese Patent Application Laid-Open No. 2000-164875, a concave portion is provided in a substrate and a lower light shielding film is formed on the entire inner wall surface of the concave portion. Thus, the channel forming region of a TFT is formed so as to be buried in the concave portion. Also, an upper light shielding film is formed together.

However, according to the structure disclosed in the above publication, unevenness is formed near a TFT on which various wirings are concentrated. Thus, a possibility of reducing a yield is high because, at the time of wiring formation, a short circuit and a break of wirings are easily caused, or the wirings are easily deteriorated by the concentration of an electric field.

Also, according to the structure disclosed in the above publication, a gap is present between the upper light shielding film and the lower light shielding film. Thus, in the case of such a structure, there is also a possibility that a photo leak current by stray light is caused. Further, since the concave portion is provided in the substrate, there is a possibility that the mechanical strength of the substrate is reduced.

In the case of a projector for which a high intensity and a high definition are required, first, the intensity of a lamp used as a light source is increased to increase a display brightness. Second, the number of pixels in a panel used for an optical system is increased to obtain a higher definition. However, in the conventional methods of forming the light shielding film between the pixel electrode and the TFT and of forming the light shielding film between the substrate and the semiconductor layer, there is a problem that light diffracted by end portions of the light shielding film is incident into the semiconductor layer to cause a photo leak current.

Further, with increasing the intensity of the light source, an adverse affect on the TFT by the diffracted cannot be neglected any longer.

Also, when a thin insulating film is used for isolating the light shielding film and the TFT, the intensity of the diffracted light in the position of the TFT call be reduced to a negligible extent. However, when the insulating film is made thinner, a parasitic capacitance produced between the TFT and the insulating film is increased. Therefore, a problem occurs in that an operation of the TFT is influenced by a potential of the light shielding film.

Also, when a width of the light shielding film is expanded, a problem that diffracted light is incident into the TFT can be solved. However, it is natural to reduce an aperture ratio. In addition, since the requirement for a high definition of display is satisfied by increasing the number of pixels, a size of respective pixels is decreased. Thus, a reduction in an aperture ratio due to the expansion of the width of the light shielding film and a reduction in brightness accompanied by such a reduction become a large problem.

Also, only when the width of the light shielding film is expanded, a problem that stray light produced by unintended scattering in an interlayer insulating film is incident into the TFT (in particular, the semiconductor layer) cannot be solved. With increasing the intensity of the light source as described above, the influence of the stray light also cannot be neglected.

Also, in a TFT including an active layer having a crystalline structure, which has been actively used because of its high field effect mobility and the like, a photo leak current tends to increase as compared with a TFT including an amorphous semiconductor layer. If the TFT have no sufficient storage capacitance, stored charges are decreased by the leak current to change the amount of light to be transmitted, which becomes a cause for reducing a contrast in image display. Thus, it is necessary to form a storage capacitor element capable of securing a sufficient capacitance in a liquid crystal panel.

However, when an area of the storage capacitor is expanded in two dimensions to secure the sufficient capacitance, an occupying ratio of the storage capacitor element to an area of a pixel is increased to reduce an aperture ratio.

Further, in order to improve a yield, it is necessary to use a structure in which a break of wiring and the like are not caused by unevenness due to the presence of the storage capacitor.

SUMMARY OF THE INVENTION

Therefore, the present invention has been made in view of the above problems, and an object of the present invention is to provide a method of realizing a semiconductor device having a structure in which a sufficient light shielding property is compatible with a sufficient storage capacitance without reducing an aperture ratio.

In order to solve the above problems, the present inventor considered a structure for reducing diffracted light and stray light, which are incident into the semiconductor layer of a TFT by forming a light shielding film so as to cover and fit the TFT.

FIG. 1A shows one example of a structure of a pixel for which the present invention is adopted.

A light shielding film is formed between a pixel electrode and a TFT. In this specification, a light shielding film in which at least a portion thereof is formed between the pixel electrode and the TFT is called an upper light shielding film. In the pixel, a groove is formed between a region through which light is transmitted and for which display is controlled and the TFT, and then a conductive film as the upper light shielding film is formed. It is different from a conventional structure having the light shielding film formed between the TFT and the pixel electrode. That is, the upper light shielding film is continuously formed from a region located between the pixel electrode and the TFT to a region through which light is transmitted so that the TFT is covered and fit with the upper shielding film.

FIG. 1B shows another structure of a TFT for which the present invention is adopted.

A TFT composed of a semiconductor layer, a gate insulating film, and a gate electrode is formed and an interlayer insulating film is formed. After that, the gate insulating film and the interlayer insulating film in a region through which light is transmitted and for which display is controlled in a later stage and its surrounding region are removed. In this specification, a hole-shaped region (having a wall surface and a bottom surface) is called a window for the sake of simplification, in which a portion of the gate insulating film and a portion of the interlayer insulating film are removed and which has the substantially same area as a region (opening portion) intended to control display in a display device. The upper light shielding film and the insulating film are formed in the wall surface of the window. Thus, although the area of the opening portion is smaller than that of the window by the film thickness, it can be said that the area of the window and that of the opening portion are substantially identical to each other.

Here, when the window shown in FIG. 1B is compared with the groove shown in FIG. 1A, since the window has a small aspect ratio, the formation of the upper light shielding film is simple and easy. Next, a light shielding film is continuously formed to cover a region from the top of the TFT to the side surface of the window. After that, the light shielding film formed on the bottom surface of the window (in particular, a region through which light is transmitted) is removed, and then an insulating film is formed and the window is filled with a transparent organic resin film made of acrylic or the like for leveling. Next, an insulating film is formed such that the light shielding film is not in contact with a pixel electrode and then the pixel electrode is formed. Thus, the structure is obtained such that the TFT is covered and fit with the upper light shielding film and the window is formed by removing the interlayer insulating film and filled with the transparent organic resin insulating film for leveling.

In the case of the above structure, an area of the region (window) in which a portion of the gate insulating film and a portion of the interlayer insulating film are removed is substantially equal to that of the region (opening portion) intended to control display in a pixel. In addition, the region (opening portion) intended to control display has a smaller area than that of the region (window) in which at least the portion of the gate insulating film and the portion of the interlayer insulating film are removed.

FIG. 1C shows another structure of a pixel for which the present invention is adopted. In the example shown in FIG. 1C, in order to also block light incident from a substrate side, a light shielding film is formed between the substrate and a semiconductor film before the formation of the semiconductor film. Note that the light shielding film formed between the substrate and the semiconductor film is hereinafter called a lower light shielding film in this specification. Next, a TFT composed of a semiconductor layer, a gate insulating film, and a gate electrode is formed and an interlayer insulating film is formed. After that, the gate insulating film and the interlayer insulating film which are formed in a region for which display is controlled later and its surrounding region are removed to form a window. Next, a light shielding film is continuously formed from the top of the TFT to the window. After that, the lower light shielding film formed on the bottom surface of the window and the upper light shielding film are removed to form an opening portion (region intended to control display). Next, an insulating film is formed and the window is filled with a transparent organic resin film made of acrylic or the like for leveling. Next, an insulating film is formed such that the light shielding film is not in contact with a pixel electrode and then the pixel electrode is formed. Thus, the structure is obtained such that the TFT is covered with the upper light shielding film and completely light-shielded by the upper light shielding film and the lower light shielding film. Note that, if a ground potential is provided for the upper light shielding film and the lower light shielding film, the TFT can be electrically shielded.

Further, when a color filter is formed in a counter substrate side, there is a problem that a matching accuracy between the counter substrate and a TFT substrate is reduced due to a decrease of a pixel size for high definition display. Thus, a method of forming the color filter in a TFT substrate side is considered. However, for the orientation of liquid crystal, it is necessary to form a pixel electrode after the formation of the color filter. Here, since the color filter having a thickness of 1 μm or larger is required, it is difficult to electrically connect the pixel electrode and a drain electrode which are isolated by the color filter.

Therefore, in the examples shown in FIGS. 1B and 1C when the window is filled with a photoresist film colored with R (red), G (green) or B (blue) for leveling, the same function is obtained as in the case of the color filter formed in a counter substrate.

Also, although not shown, in the structure shown in FIG. 1B or 1C, the upper light shielding film is made of a material having a high reflectance such as aluminum. In addition, the upper light shielding film on the bottom surface of the region (window) in which at least the portion of the gate insulating film and the portion of the interlayer insulating film are removed is not removed and is used as a reflective plate. In this case, a reflection type display device can be also obtained.

According to the present invention, there is provided a semiconductor device comprising: a substrate; a TFT located over the substrate; a pixel electrode electrically connected with the TFT; an upper light shielding film located between the TFT and the pixel electrode; at least one interlayer insulating film formed over the TFT; and a window formed between the pixel electrode and the substrate by removing the interlayer insulating film, the semiconductor device being characterized in that the upper light shielding film is continuously formed from a bottom surface of the window to a surface of the interlayer insulating film to cover and fit the TFT, and an area of the window is substantially equal to that of the opening portion.

Also, according to the present invention, there is provided a semiconductor device comprising: a substrate; a lower light shielding film located on the substrate, a TFT located over the lower light shielding film; a pixel electrode electrically connected with the TFT; an upper light shielding film located between the TFT and the pixel electrode; at least one interlayer insulating film formed over the TFT; and a window which is formed between the pixel electrode and the substrate by removing the interlayer insulating film and provided with an opening portion, the semiconductor device being characterized in that the upper light shielding film is continuously formed from a bottom surface of the window to a surface of the interlayer insulating film to cover and fit the TFT, and an area of the window is substantially equal to that of the opening portion.

Also, according to the present invention, there is provided a semiconductor device comprising: a substrate; a lower light shielding film located on the substrate;

a TFT located over the lower light shielding film; a pixel electrode electrically connected with the TFT; an upper light shielding film located between the TFT and the pixel electrode; at least one interlayer insulating film formed over the TFT; and a window formed between the pixel electrode and the substrate by removing the interlayer insulating film, the semiconductor device being characterized in that the upper light shielding film is continuously formed from a bottom surface of the window to a surface of the interlayer insulating film to cover and fit the TFT, and the lower light shielding film is in contact with the upper light shielding film at the bottom surface of the window.

Also, according to the present invention, there is provided a semiconductor device comprising: a substrate; a lower light shielding film located on the substrate; a TFT located over the lower light shielding film; a storage capacitor element formed in parallel to the TFT; a pixel electrode electrically connected with the TFT; an upper light shielding film located between the TFT and the pixel electrode; at least one interlayer insulating film formed over the TFT and the storage capacitor element; and a window formed between the pixel electrode and the substrate by removing the interlayer insulating film, the semiconductor device being characterized in that the lower light shielding film is in contact with the upper light shielding film at a bottom surface of the window.

Also, according to the present invention, there is provided a semiconductor device comprising: a substrate; a TFT located over the substrate; a pixel electrode electrically connected with the TFT; a light shielding film located between the TFT and the pixel electrode; at least one interlayer insulating film formed over the TFT; and a window formed between the pixel electrode and the substrate by removing the interlayer insulating film, the semiconductor device being characterized in that the window is filled with a transparent organic insulating film for leveling, and the light shielding film is continuously formed from a bottom surface of the window to a surface of the interlayer insulating film to cover and fit the TFT.

Also, according to the present invention, there is provided a semiconductor device comprising: a substrate; a lower light shielding film located on the substrate; a TFT located over the lower light shielding film; a pixel electrode electrically connected with the TFT; a laminate body which is located between the TFT and the pixel electrode and provided with a plurality of upper light shielding films and a plurality of insulating films which are alternately laminated; at least one interlayer insulating film formed over the TFT; and a window formed between the pixel electrode and the substrate by removing the interlayer insulating film, the semiconductor device being characterized in that the window is filled with a transparent organic insulating film for leveling, and the plurality of laminated light shielding films are formed from a bottom surface of the window to cover and fit the TFT.

Also, according to the present invention, there is provided a semiconductor device comprising: a substrate; a lower light shielding film located over the substrate; a TFT located on the lower light shielding film; a pixel electrode electrically connected with the TFT; a laminate body which is located between the TFT and the pixel electrode and has a plurality of upper light shielding films and a plurality of insulating films which are alternately laminated; at least one interlayer insulating film formed over the TFT; and a window formed between the pixel electrode and the substrate by removing the interlayer insulating film, the semiconductor device being characterized in that the window is filled with a transparent organic insulating film for leveling, the plurality of laminated light shielding films are formed from a bottom surface of the window to cover and fit the TFT, and at least one upper light shielding film of the laminate body is electrically connected with the TFT and the pixel electrode.

Also, according to the present invention, there is provided a semiconductor device comprising: a substrate; a lower light shielding film located on the substrate; a TFT located over the lower light shielding film; a pixel electrode electrically connected with the TFT; a laminate body which is located between the TFT and the pixel electrode and has a plurality of upper light shielding films and a plurality of insulating films which are alternately laminated; at least one interlayer insulating film formed over the TFT; and a window formed between the pixel electrode and the substrate by removing the interlayer insulating film, the semiconductor device being characterized in that the window is filled with a transparent organic insulating film for leveling, the plurality of laminated light shielding films are formed from a bottom surface of the window to cover and fit the TFT and a storage capacitor element is formed by the insulating film and the plurality of upper light shielding films which are formed via the insulating film in the laminate body.

Also, according to the present invention, there is provided a semiconductor device comprising: a substrate; a TFT located over the substrate; a pixel electrode electrically connected with the TFT; a laminate body which is located between the TFT and the pixel electrode and has a plurality of upper light shielding films and a plurality of insulating films which are alternately laminated; at least one interlayer insulating film formed over the TFT; a window formed between the pixel electrode and the substrate by removing the interlayer insulating film; and a wiring for electrically connecting the TFT and the pixel electrode, the wiring being one layer of the upper light shielding films which are formed from a bottom surface of the window to cover and fit the TFT, the semiconductor device being characterized in that an area of the window substantially equal to that of a region which is intended to control display in a pixel.

Also, according to the present invention, there is provided a semiconductor device characterized by further comprising a lower light shielding film formed between the substrate and the TFT.

Also, according to the present invention, there is provided a semiconductor device characterized in that a first layer of the upper light shielding layers is in contact with the lower light shielding film at the bottom surface of the window between the pixel electrode and the substrate.

Also, according to the present invention, there is provided a semiconductor device characterized in that the window includes a photoresist film colored with one of R (red), G (green), and B (blue) and a transparent organic insulating film.

Also, according to the present invention, there is provided a method of manufacturing a semiconductor device characterized by comprising: forming a semiconductor layer over an insulating surface; forming a gate insulating film on the semiconductor layer; forming a gate electrode on the gate insulating film; forming a first interlayer insulating film on the gate electrode; forming a second interlayer insulating film on the first interlayer insulating film; forming a first contact hole which reaches the semiconductor layer and forming a wiring for electrically connecting among respective TFTs; forming a third interlayer insulating film to cover the wiring; forming a groove which reaches a substrate between a region through which light is transmitted and a TFT; continuously forming a light shielding film from a region located over the third interlayer insulating film to the groove; forming a second contact hole for connecting a pixel electrode and the wiring; forming a fourth interlayer insulating film on the light shielding film; removing a portion of an insulating film formed in the second contact hole to expose the wiring; and forming the pixel electrode.

According to the present invention, there is provided a method of manufacturing a semiconductor device characterized by comprising: forming a semiconductor layer over an insulating surface; forming a gate insulating film on the semiconductor layer; forming a gate electrode on the gate insulating film; forming a first interlayer insulating film on the gate electrode; forming a second interlayer insulating film on the first interlayer insulating film; forming a first contact hole which reaches the semiconductor layer and forming a wiring for electrically connecting among respective TFTs; forming a third interlayer insulating film to cover the wiring; removing a base insulating film, the gate insulating film, the first interlayer insulating film, and the second interlayer insulating film in a region through which light is transmitted to form a window which reaches a substrate; forming an upper light shielding film on the third interlayer insulating film to cover a TFT; removing a lower light shielding film formed on a bottom surface of the window; forming a second contact hole in the upper light shielding film; forming a fourth interlayer insulating film on the upper light shielding film; filling the window with a transparent insulating film for leveling; forming a fifth interlayer insulating film on the upper light shielding film; removing a portion of an insulating film filled into the second contact hole to expose the wiring; and forming a pixel electrode on the fifth interlayer insulating film.

According to the present invention, there is provided a method of manufacturing a semiconductor device characterized by comprising: forming a semiconductor layer over an insulating surface; forming a gate insulating film on the semiconductor layer; forming a gate electrode on the gate insulating film; forming a first interlayer insulating film on the gate electrode; forming a second interlayer insulating film on the first interlayer insulating film; forming a first contact hole which reaches the semiconductor layer and forming a wiring for electrically connecting among respective, TFTs; forming a third interlayer insulating film to cover the wiring; removing a base insulating film, the gate insulating film, the first interlayer insulating film, and the second interlayer insulating film in a region through which light is transmitted to form a hole which reaches a substrate; forming an upper first light shielding film on the third interlayer insulating film to cover a TFT; forming a second contact hole which reaches the wiring in the upper first light shielding film and the third interlayer insulating film; forming a first insulating film on the upper first light shielding film; removing a portion of the first insulating film filled into the second contact hole to expose the wiring; forming an upper second light shielding film on the first insulating film; forming a second insulating film on the upper second light shielding film; forming an upper third light shielding film on the second insulating film; removing a lower light shielding film, the upper first light shielding film, the first insulating film, the upper second light shielding film, the second insulating film, and the upper third light shielding film, which are formed on a bottom surface of the hole; forming a third contact hole which reaches the upper second light shielding film in the upper third light shielding film and the second insulating film; forming a fourth interlayer insulating film; filling the hole with a transparent insulating film for leveling; forming a fifth interlayer insulating film on the upper third light shielding film; removing a portion of an insulating film filled into the third contact hole to expose the upper second light shielding film; and forming a pixel electrode on the fifth interlayer insulating film.

Also, according to the present invention, there is provided a method of manufacturing a semiconductor characterized by comprising forming a lower light shielding film on the insulating surface.

Also, according to the present invention, there is provided a method of manufacturing a semiconductor characterized in that a lower light shielding film, the upper first light shielding film, and the upper third light shielding film are connected with a wiring having a ground potential.

Also, according to the present invention, there is provided a method of manufacturing a semiconductor characterized in that a lower light shielding film is in contact with an upper first light shielding film at the bottom surface of the window.

Also, according to the present invention, there is provided a method of manufacturing a semiconductor characterized in that a leveling step for the window is performed using an organic insulating film.

Also, according to the present invention, there is provided a method of manufacturing a semiconductor characterized in that a leveling step for the window is performed by laminating a photoresist film colored with one of R (red), G (green), and B (blue) and a transparent organic insulating film.

Also, according to the present invention, there is provided a method of manufacturing a semiconductor characterized in that the semiconductor layer is crystallized by irradiation of laser light.

Also, according to the present invention, there is provided a method of manufacturing a semiconductor characterized in that the semiconductor layer is a crystalline semiconductor layer obtained by reducing a concentration of a catalytic element in the semiconductor layer by gettering the catalytic element after crystallization using the catalytic element.

As described above, according to the present invention, the structure is used in which the TFT is covered with the light shielding film to prevent the occurrence of a photo leak current by light incident into the semiconductor layer of the TFT without intention, such as diffracted light or stray light.

BRIEF DESCRIPTION OF THE DRAWINGS

In the accompanying drawings:

FIGS. 3A and 3B show one example in accordance with the embodiment of the present invention;

FIGS. 11A to 11F show examples of electrical appliances;

DETAILED DESCRIPTION OF THE PREFERRED EMBODIMENTS

Embodiment Mode 1

Figure 1A:
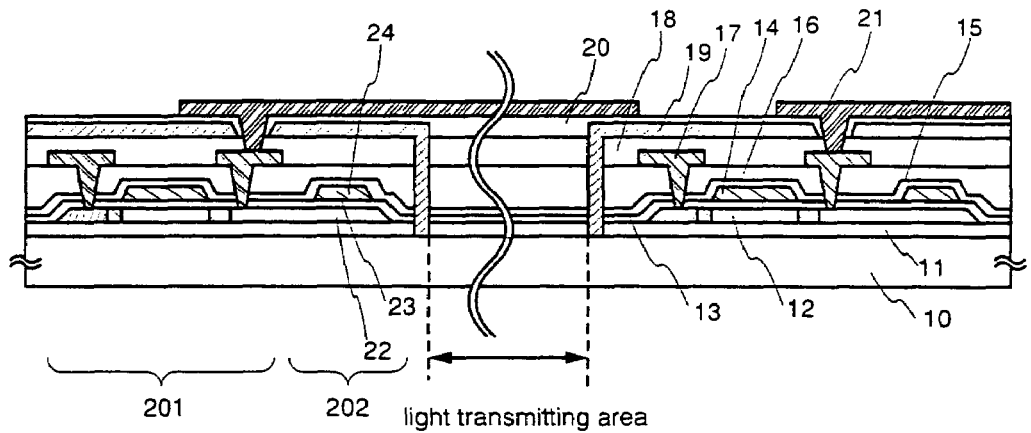
FIGS. 1A to 1C show examples of semiconductor devices manufactured according to the present invention.

A structure of a transmission type liquid crystal display device manufactured according to the present invention will be described with reference to FIG. 1A.

A base insulating film 11 is formed on a substrate 10. A TFT composed of a semiconductor layer 12, a gate insulating film 13, and a gate electrode 14 is formed on the base insulating film 11.

A first interlayer insulating film 15 and a second interlayer insulating film 16 are formed on the gate electrode 14. The second interlayer insulating film 16 is leveled if necessary. Subsequently, a wiring 17 for electrically connecting among respective TFTs is formed to connect with the source region or the drain region of the semiconductor layer 12. A third interlayer insulating film 18 is formed to cover the wiring 17, and then a groove is formed in the boundary between the TFT and an opening portion. The groove is formed so as to reach the substrate. Next, a conductive film is continuously formed from a surface of the third interlayer insulating film 18 into the groove by a metal CVD method to form a light shielding film 19.

Subsequently, a fourth interlayer insulating film 20 is formed and then a pixel electrode 21 is formed so as not to be in contact with the light shielding film 19.

Note that a storage capacitor 202 is composed of a region 22 extended from the semiconductor layer 12 (one electrode of a storage capacitor), an insulating film 23 which is the same layer as the gate insulating film 13 (dielectric), and a capacitor wiring 24 which is the same layer as the gate electrode 14 (the other electrode of the storage capacitor).

With respect to a structure of a semiconductor device of the present invention, each of pixels in a pixel portion has a TFT 201 covered with the light shielding film 19, which is continuously formed from a region between the TFT 201 and the pixel electrode to the boundary between the TFT 201 and the opening portion (region which is intended to control display). In addition, in a region of each pixel through which light is transmitted, the base insulating film 11, the gate insulating film 13, the first interlayer insulating film 15, the second interlayer insulating film 16, the third interlayer insulating film 18, and the fourth interlayer insulating film 20 are laminated between the pixel electrode and the substrate.

In the TFT having the structure shown in FIG. 1A, a light shielding film (lower light shielding film) may be provided between the substrate 10 and the semiconductor layer 12. In this case, a depth of the groove filled with the light shielding film is preferably determined as appropriate by a performer. The depth may be one in which the groove reaches the lower light shielding film or one in which the groove does not reach the lower light shielding film.

Embodiment Mode 2

Figure 1B:
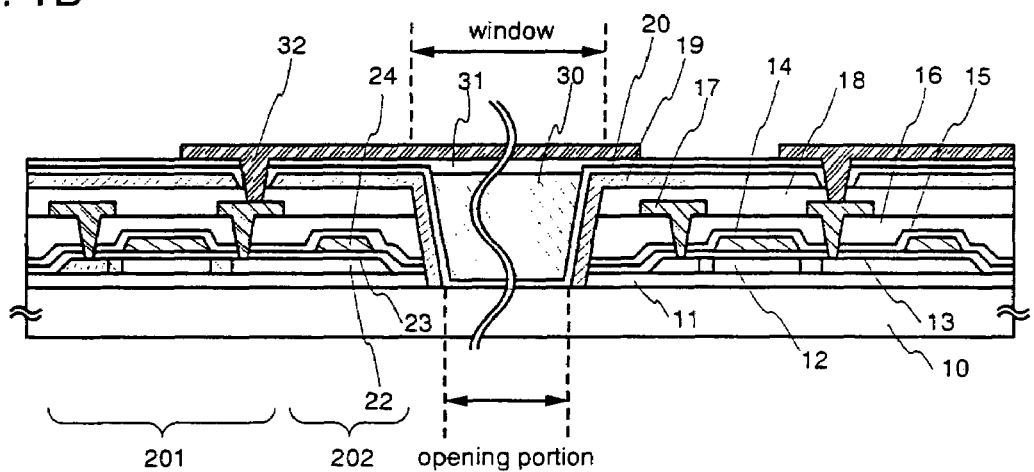

Another structure of a TFT of the present invention will be described with reference to FIG. 1B. Note that the same reference symbol is used in the case where the same member as in shown in FIG. 1A is indicated.

A base insulating film 11 is formed on a substrate 10. A TFT composed of a semiconductor layer 12, a gate insulating film 13, and a gate electrode 14 is formed on the base insulating film 11.

A first interlayer insulating film 15 and a second interlayer insulating film 16 are formed on the gate electrode 14. The second interlayer insulating film 16 is leveled if necessary. Subsequently, a wiring 17 for electrically connecting among respective TFTs is formed to connect with the source region or the drain region of the semiconductor layer 12. A third interlayer insulating film 18 is formed to cover the wiring 17, and then the third interlayer insulating film 18, the second interlayer insulating film 16, the first interlayer insulating film 15, the gate insulating film 13, and the base insulating film 11 in a region somewhat wider than the opening portion (region which is intended to control display) are removed. Next, a conductive film is continuously formed from a surface of the third interlayer insulating film 18 to the side surface of a region in which the gate insulating film and the interlayer insulating films are removed (window) to form an upper light shielding film 19. Next, the upper light shielding film 19 formed on the bottom surface of the window is removed and a fourth interlayer insulating film 20 is formed. After that, the window is filled with a transparent organic insulating film 30 or the like to be leveled, a fifth interlayer insulating film 31 is formed thereon, and a pixel electrode 32 is formed.

In the TFT of the present invention, the light shielding film is formed to cover and fit the TFT from the bottom surface of the region in which at least a portion of the gate insulating film and portions of the interlayer insulating films are removed (window). There is the opening portion inside the window. In this embodiment mode, since an aspect ratio of the window is small, even when a sputtering method easier than a metal CVD method is used for manufacturing the upper light shielding film 19, preferable coverage can be obtained.

Also, since the TFT can be covered with the light shielding film, the occurrence of a photo leak current can be suppressed.

Embodiment Mode 3

Figure 1C:
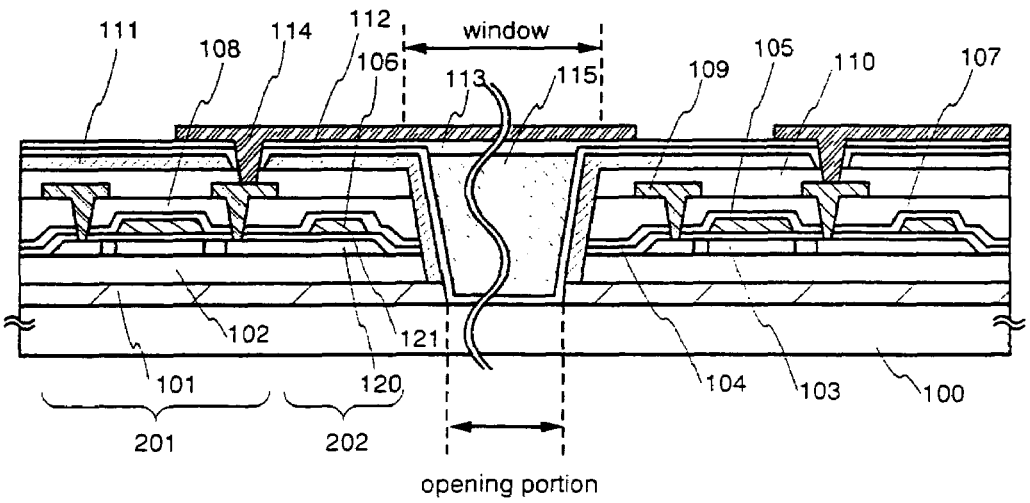

Another structure of a TFT of the present invention will be described with reference to FIG. 1C.

A lower light shielding film 101 is formed on a substrate 100. A base insulating film 102, a semiconductor layer 103, and a gate insulating film 104 are formed in order on the lower light shielding film 101. A gate electrode 105 is formed on the gate insulating film 104 and a first interlayer insulating film 107 and a second interlayer insulating film 108 are formed on the gate electrode 105. A wiring 109 connected with the source region or the drain region of the semiconductor layer 103 is formed on the second interlayer insulating film. A third interlayer insulating film 110 is formed to cover the wiring 109. An upper light shielding film 111 is provided on the third interlayer insulating film 110.

Also, a pixel electrode 114 is formed on the upper light shielding film 111 via an insulating film 112. The pixel electrode 114 is connected with a wiring connected with the drain region of a TFT, through a contact hole formed in the upper light shielding film 111 and the third interlayer insulating film 110. A storage capacitor 202 is composed of a semiconductor layer 120, an insulating film 121, and a capacitor wiring 106. The semiconductor layer 120 is extended from the drain region and becomes one electrode of the storage capacitor. The insulating film 121 which is the same layer as the gate insulating film becomes a dielectric of the storage capacitor. The capacitor wiring 106 formed in the same layer as the gate electrode becomes the other electrode of the storage capacitor.

Such a TFT 201 and the storage capacitor 202 are formed in each of pixels. Note that an opening portion is formed inside the window in which the third interlayer insulating film 110, the second interlayer insulating film 108, the first interlayer insulating film 107, the gate insulating film 104, and the lower light shielding film 101 are removed. The upper light shielding film is continuously formed from a surface of the second interlayer insulating film 108 to the wall surface of the window. However, the upper light shielding film formed on the bottom surface of the window is removed.

The lower light shielding film 101 and the upper light shielding film 111 are formed to be in contact with each other at the bottom of the window so as to make the same ground potential. Although not shown, these films are connected with a wiring for providing a ground potential.

Note that the window is filled with an organic insulating film 115 made of acrylic or the like for leveling. After leveling, an interlayer insulating film 113 is formed thereon, and a pixel electrode 114 is formed. The pixel electrode 114 is electrically connected with the wiring connected with the drain region of the semiconductor layer 103. The TFT 201 and the pixel electrode 114 are electrically connected with each other.

As described above, a liquid crystal panel can be manufactured in which the upper light shielding film 111 is formed to cover and fit the TFT in the pixel portion and the TFT is completely light-shielded by the lower light shielding film 101 and the upper light shielding film 111.

Embodiment 1

In this embodiment, steps of manufacturing an active matrix substrate according to the present invention will be described.

Figure 2A:
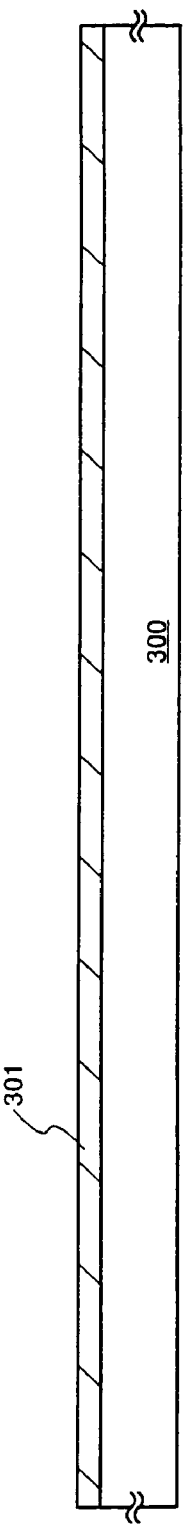
FIGS. 2A to 2C show one example in accordance with an embodiment of the present invention.

First, in order to form a lower light shielding film 301 on a quartz substrate 300, a polysilicon film and a WSix film are laminated. Note that, with respect to the lower light shielding film 301, a light shielding property in which a requirement level is satisfied is required and a heat resistance to heat treatment for activation of a TFT is essential. Further, since it is preferable that a ground potential is provided, the lower light shielding film is preferably a conductive film. Thus, one kind or plural kinds of films selected from the group consisting of a polysilicon film, $WSi_x$ (x=2.0 to 2.8) film, and a film made of a conductive material such as Al, Ta, W, Cr. or Mo may be used as the lower light shielding film (FIG. 2A).

Subsequently, a base insulating film 302 is formed on the lower light shielding film 301. The base insulating film 302 is obtained by forming an insulating film including silicon (for example, a silicon oxide nitride film, a silicon nitride oxide film, or a silicon nitride film) by an LPCVD method, a plasma CVD method, or a sputtering method. Then, an amorphous semiconductor film (not shown) is formed on the base insulating film 302. Although the amorphous semiconductor film is not particularly limited, it is preferably made of a silicon film, a silicon germanium ($Si_xGe_{1-x}$: 0<x<1, typically, x=0.001 to 0.05) alloy, or the like. Note that, here, an amorphous silicon film is formed at a film thickness of 65 nm.

Next, the amorphous silicon film is crystallized. Heat treatment is performed using a furnace at 600° C. for 24 hours to form a crystalline silicon film (not shown). Note that a silicon oxide film is formed in the surface of the silicon film by the crystallization processing. Since this film is an extremely thin film which can be removed by etching or the like, no problem is caused.

Next, the oxide film formed in the surface of the crystalline silicon film is removed, and then heat treatment for improving a film quality of the semiconductor film is performed before a gate insulating film 304 is formed. Heat treatment is performed for the crystalline silicon film at 900° C. to 1050° C. to form an oxide film in the surface of the crystalline semiconductor film. This silicon oxide film is removed. Heat treatment is preferably performed for the crystalline silicon film to form the silicon oxide film in the surface thereof such that a final film thickness of the crystalline silicon film becomes 30 nm to 50 nm. In this embodiment, the film thickness of the crystalline silicon film is set to be 35 nm. Subsequently, the obtained crystalline silicon film is formed in a predetermined shape to form a semiconductor layer 303 having an area for a channel forming region, a source region, and a drain region of a TFT and an area for a wiring as one electrode of a storage capacitor.

Figure 2B:
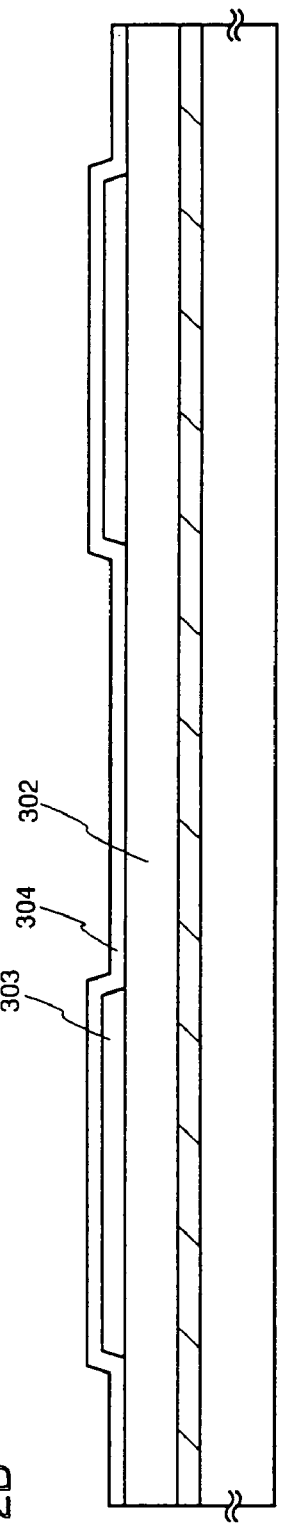

Next, the gate insulating film 304 is formed on the semiconductor layers (FIG. 2B). Subsequently, an impurity element for providing a p-type (hereinafter referred to as a p-type impurity element) is added to the semiconductor layer in an area as a p-channel TFT through the gate insulating film 304. An element belonging to group 13 of the periodic table, typically, boron (B) or gallium (Ga) can be used as the p-type impurity element. This step is performed for controlling a threshold voltage of the TFT, which is called a channel dope step. The p-type impurity element is added to the semiconductor layer at a concentration of $1\times10^{15}/$ cm$^3$ to $1\times10^{18}/$cm$^3$ in this step.

Next, a mask made of a resist is formed and an impurity element for providing an n-type (hereinafter referred to as an n-type impurity element and phosphorus is used here) is added to the semiconductor layer in portions as the source region and the drain region of an n-channel TFT and one electrode of a storage capacitor to form n-type impurity regions including phosphorus at a high concentration. Phosphorus is included in the regions at a concentration of $1\times10^{20}/$ cm$^3$ to $5\times10^{21}/$cm$^3$.

Next, a gate electrode 305a and a wiring 305b as one electrode of the storage capacitor (hereinafter referred to as a capacitor wiring) are formed, TaN, Ta, Ti, Mo, W, Cr, Si to which an impurity element is added, or the like can be used as a material for the gate electrode 305a and the capacitor wiring 305b. Note that plural kinds of films made of those may be laminated to form the gate electrode.

Next, an n-type impurity element is added to the semiconductor layer using the gate electrode as a mask. Here, phosphorus is used as the n-type impurity element. The regions to which the n-type impurity element is added are low concentration impurity regions serving as LDD regions of the n-channel TFT. The n-type impurity element is included in the are low concentration n-type impurity regions at a concentration of $1\times10^{16}/$cm$^3$ to $5\times10^{18}/$cm$^3$.

Next, a region as the n-channel TFT later is covered with a mask and boron as a p-type impurity element is added to the semiconductor layer as the source region or the drain region of the p-channel TFT later to include boron at a concentration of $3\times10^{20}/$cm$^3$ to $5\times10^{21}/$cm$^3$ (not shown).

Next, a silicon nitride film, a silicon oxide nitride film, or a silicon nitride oxide film is formed as a first interlayer insulating film 306 at a film thickness of 50 nm to 500 nm by a plasma CVD method.

After that, heat treatment is performed for activating the impurity element added to the respective semiconductor layers. A method using a furnace, a method using laser light irradiation, a lamp anneal method, or a combination thereof may be performed as the heat treatment method. The activation is conducted in an inert gas atmosphere at 550° C. to 1000° C.

Next, hydrogenation is conducted for terminating dangling bonds in the semiconductor layers by thermally excited hydrogen. Heat treatment is performed in an atmosphere including hydrogen at 410° C. for 1 hour. Plasma hydrogenation processing using hydrogen excited by plasma may be performed as another hydrogenation means.

Figure 2C:
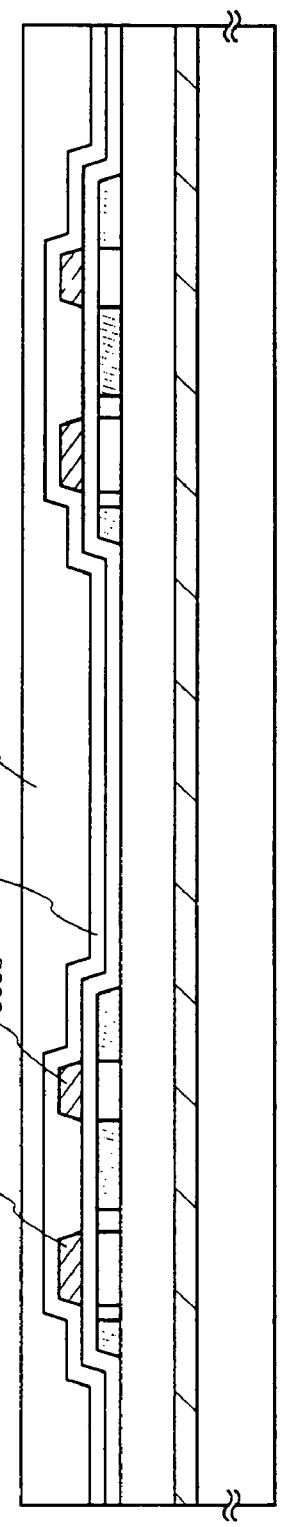

Next, a second interlayer insulating film 307 is formed at a film thickness of 500 nm to 1000 nm. An organic resin film made of acrylic, polyimide, polyamide. or BCB (benzocyclobutene) or an inorganic insulating film such as a silicon oxide nitride film, a silicon nitride oxide film may be used for the second interlayer insulating film 307. Note that, in this embodiment, a silicon oxide nitride film is formed at a film thickness of 900 nm and planarized by a CMP method (FIG. 2C).

Subsequently, first contact holes which reach the semiconductor layers 303 are formed and wirings 308 electrically connected with the respective TFTs are formed. A laminate structure in which a conductive film including mainly titanium is formed at a film thickness of 50 nm to 100 nm and then a conductive film including mainly aluminum is formed at a film thickness of 300 nm to 500 nm. is preferably used for the wirings 308. It is necessary to use a material which prevents electrolytic corrosion when being in contact with a pixel electrode for the top layer which is in contact with the pixel electrode.

Next, a third interlayer insulating film 309 is formed. The third interlayer insulating film 309 made from a silicon oxynitride film is formed at a film thickness of 600 nm (FIG. 3A).

Next, in a region substantially corresponding to an opening portion (region which is intended to control display), the interlayer insulating films, the gate insulating film, and the base insulating film which are formed by the steps until here are removed to expose the lower light shielding film. Note that a region in which the gate insulating film and the interlayer insulating films are removed (window) is formed to be wider than a region through which light is actually transmitted (opening portion).

Next, an upper light shielding film 311 is formed. A film through which light is not transmitted and which has electrical conductivity, here, a conductive film including mainly aluminum is formed as the upper light shielding film at a film thickness of 100 nm to 200 nm. Note that, since a ratio of a depth to a width (aspect ratio) in the window before the upper light shielding film is small, even when a sputtering method is used, the conductive film can be formed with a preferable coverage. The upper light shielding film is formed to be in contact with the lower light shielding film and to make the same potential. Although not shown, a wiring for providing a ground potential is connected with the lower light shielding film and the upper light shielding film.

Figure 14:
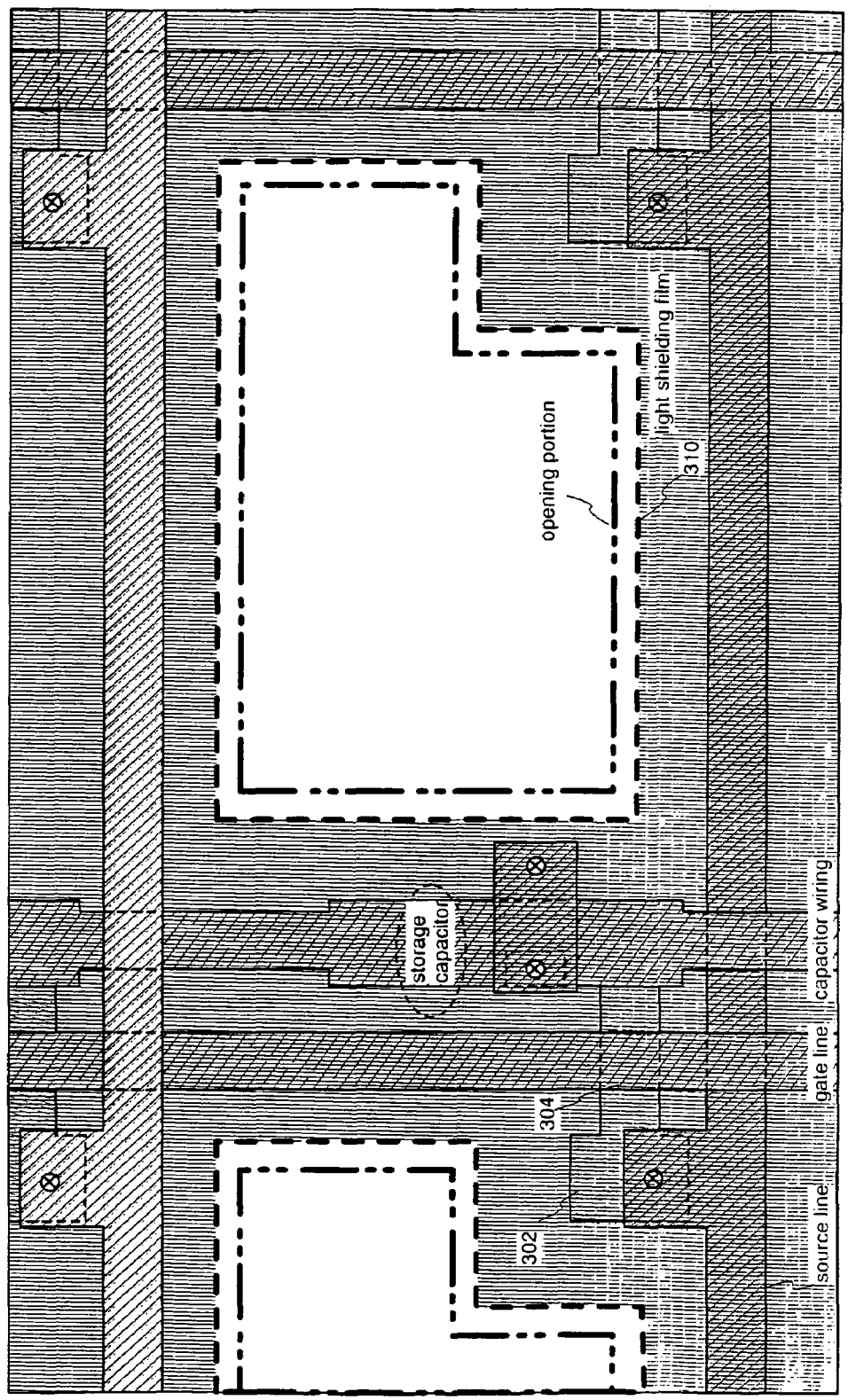
FIG. 14 shows one example in accordance with the embodiment of the present invention.

Next, the lower light shielding film and the upper light shielding film which are formed on the bottom surface of the window are removed. Also, the upper light shielding film is removed for forming a second contact hole for electrically connecting a drain electrode and a pixel electrode. In either step, etching is conducted using a pattern made of a resist as a mask. Note that, since regions to be etched have different heights and films to be removed have different laminate structures, the removing steps are separately performed for simplification of steps. Either step may be performed first (FIG. 14).

Subsequently, an insulating film 312 made from a silicon nitride film, a silicon oxide nitride film, a silicon nitride oxide film, or the like is formed on the upper light shielding film 311 by a plasma CVD method and then the window is filled with an organic insulating film 313 made of acrylic or the like for leveling (FIG. 3B).

Note that the window may be filled with a photoresist film colored with R. G. and B and then an organic resin film made of acrylic or the like may be formed. When the colored layer is used for leveling the window, a problem with respect to a color shift caused in the case where the colored layer is provided in a counter substrate side can be solved.

Figure 4:
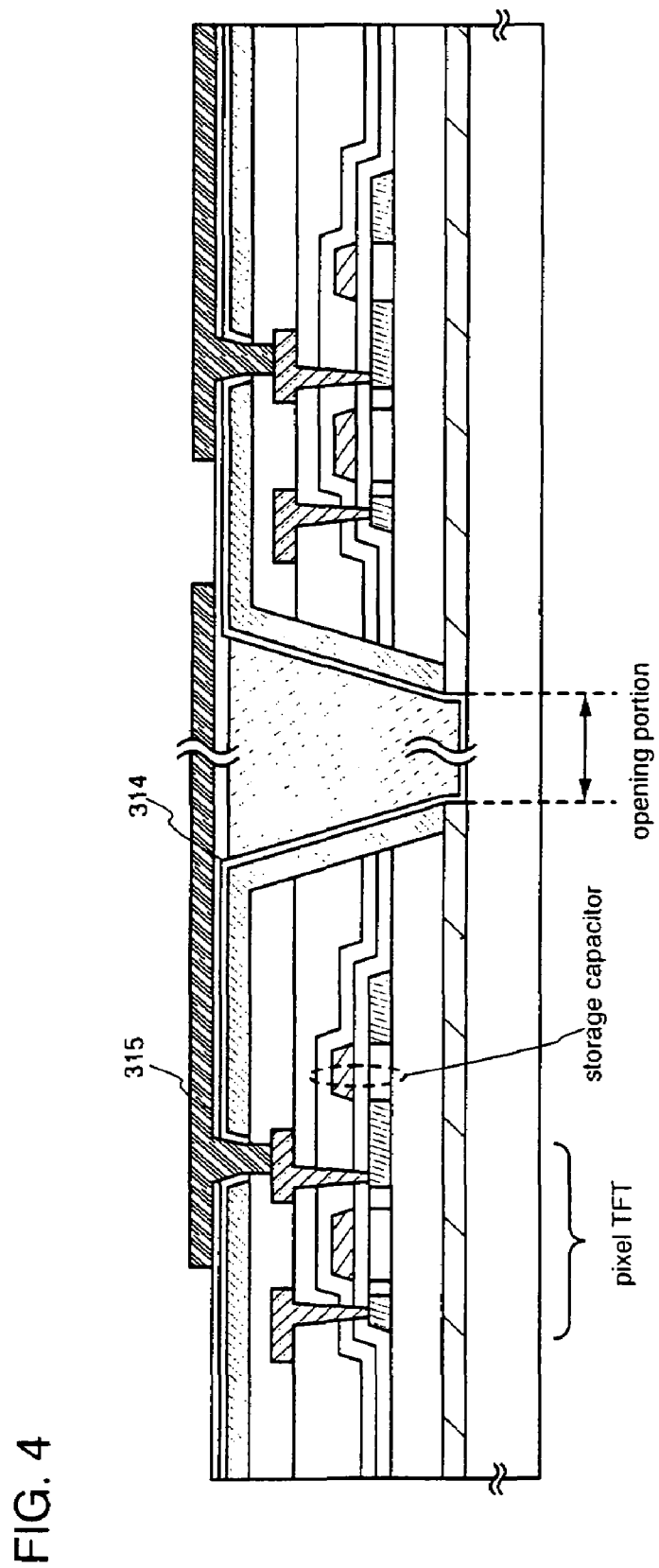
FIG. 4 shows one example in accordance with the embodiment of the present invention.
Figure 15:
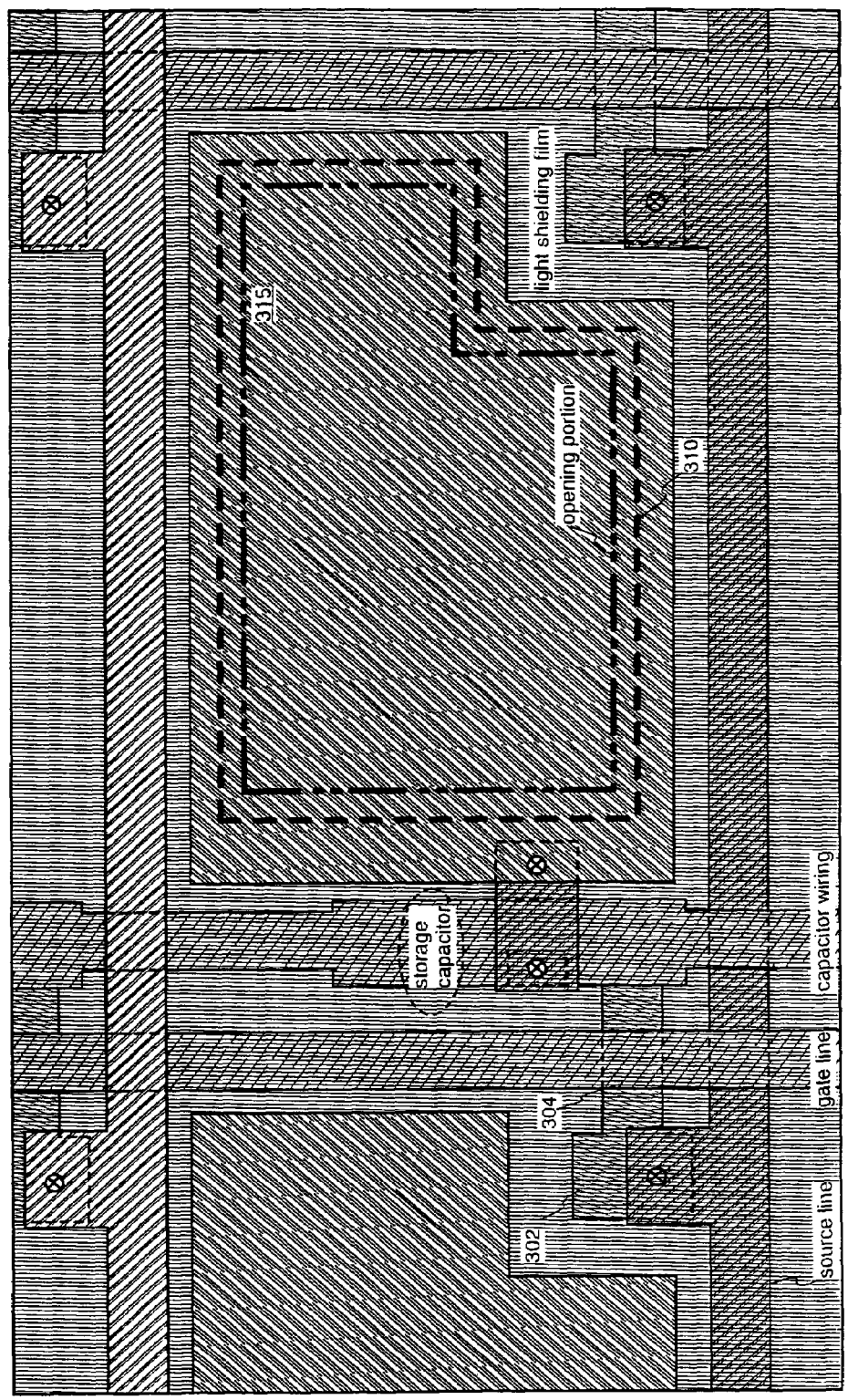
FIG. 15 shows one example in accordance with the embodiment of the present invention.

Subsequently, a fourth interlayer insulating film 314 made from a silicon nitride film, a silicon oxide nitride film, a silicon nitride oxide film, or the like is formed by a sputtering method. A portion of the insulating film with which the contact hole has been filled is removed to expose the drain electrode and then a pixel electrode 315 is formed. At this time, it is important to remove the insulating film such that the upper light shielding film 311 is not in contact with a pixel electrode 315. Note that, since a transmission liquid crystal display device is manufactured in this embodiment, a transparent ITO film (compound of indium oxide and tin oxide) is formed as the pixel electrode at a film thickness of 100 nm by sputtering method (FIGS. 4 and 15). Note that, when a metallic film having a light shielding property, for example, a pixel electrode in which Al or a conductive material is plated with Ag is formed in stead of the ITO film, a reflection liquid crystal display device can be obtained. Also, the upper light shielding film formed on the bottom surface of the window may be used as a reflecting plate without removing it. In this case, liquid crystal is controlled by the transparent pixel electrode formed on a leveling film and a counter electrode.

By such steps, the following active matrix substrate can be manufactured. That is, the active matrix substrate has on the substrate a TFT 320 which is covered with the lower light shielding film and the upper light shielding film and composed of the base insulating film, the semiconductor layer, the gate insulating film, and the gate electrode and a storage capacitor 321 which is composed of the semiconductor layer as one electrode, the insulating film which is the same layer as the gate insulating film as a dielectric, and a capacitor wiring made from the same layer as the gate electrode. A ratio of a region through which light is transmitted to a pixel area (aperture ratio) exceeds 50%.

Also, an orientation film for orienting the liquid crystal layer is formed in the thus obtained active matrix substrate, a counter substrate in which a counter electrode and an orientation film are formed and the active matrix substrate are bonded using a known cell assembly technique, and liquid crystal is injected therebetween. Therefore, an active matrix liquid crystal display device can be completed.

Embodiment 2

In this embodiment, a method of forming a plurality of upper light shielding films to form a storage capacitor along a wall surface of a region in which at least a portion of a gate insulating film and a portion of an interlayer insulating film are removed (window) will be described.

Figure 5A:
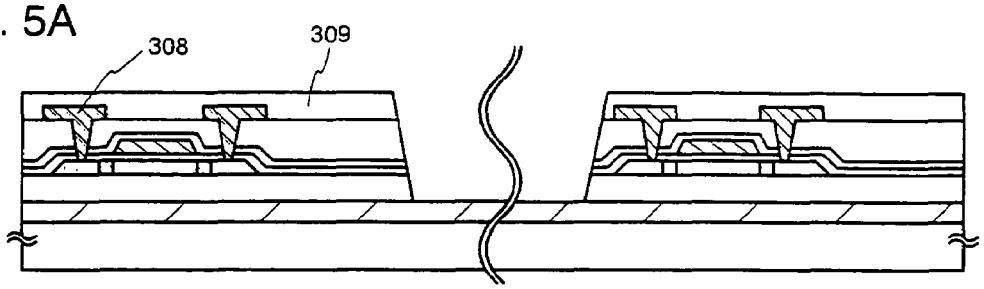
FIGS. 5A to 5D show one example in accordance with an embodiment of the present invention.
Figure 5B:
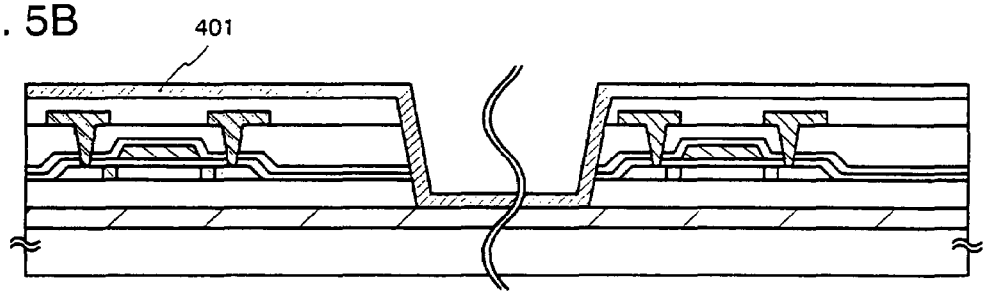
Figure 5C:
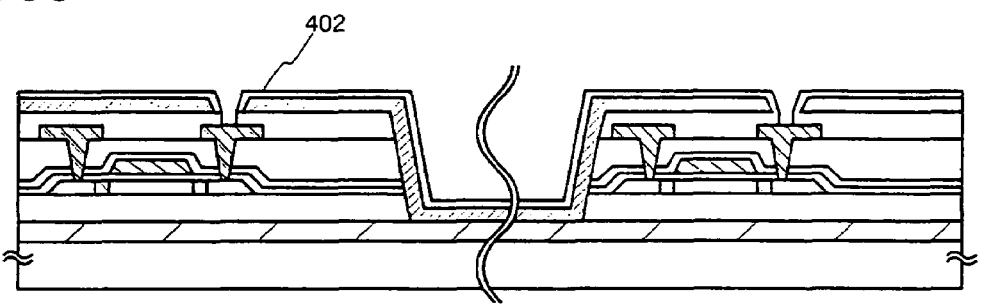
Figure 5D:
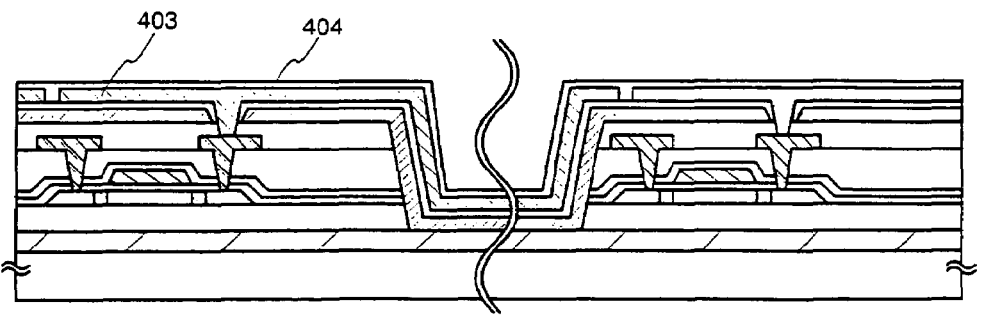
Figure 6A:
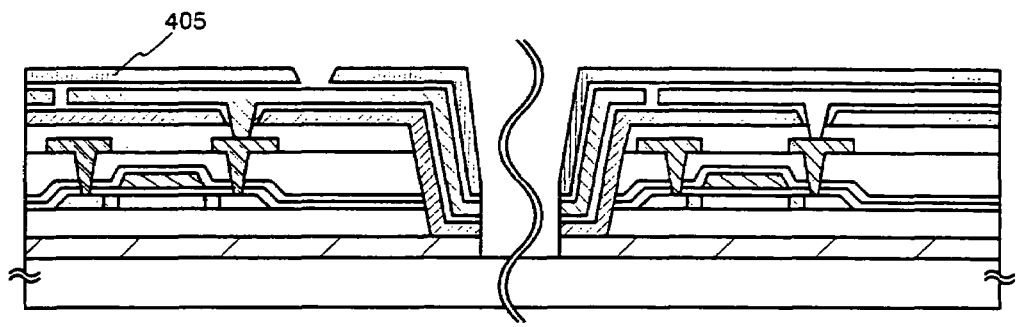
FIGS. 6A to 6D show one example in accordance with the embodiment of the present invention.
Figure 6B:
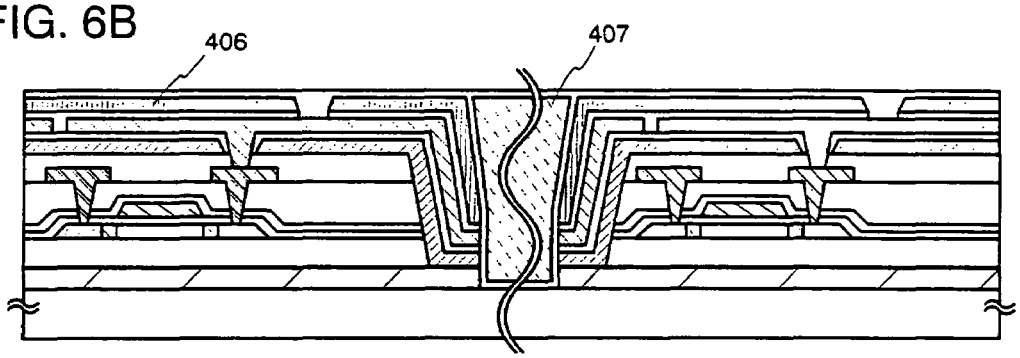
Figure 6C:
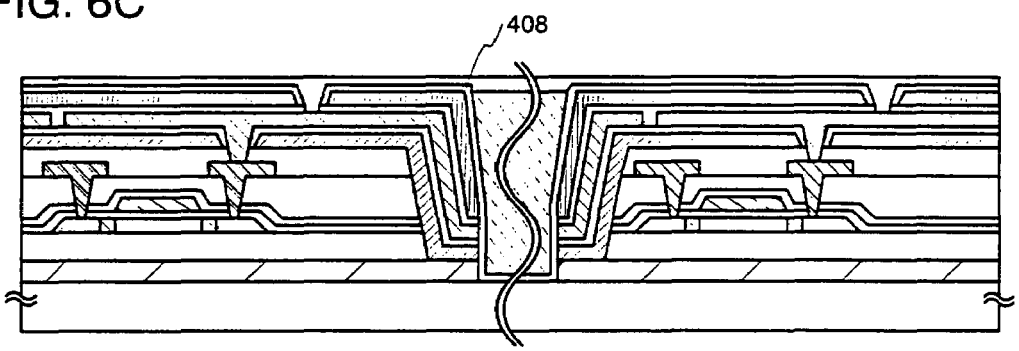
Figure 6D:
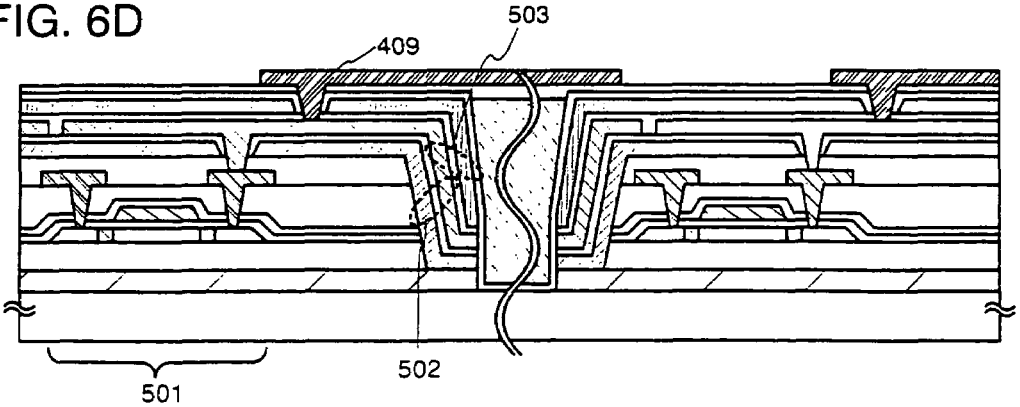

Based on the manufacturing steps indicated in Embodiment 1 the state that the lower light shielding film on the bottom surface of the window shown in FIG. 3A is exposed is obtained (FIG. 5A).

Next, an upper first light shielding film 401 is formed. A conductive film (conductive film including mainly an element selected from the group consisting of aluminum, chromium, and titanium) is formed as the upper first light shielding film 401 at a film thickness of 100 nm to 200 nm. Subsequently, second contact holes which reach the wirings 308 are formed in the upper first light shielding film 401 and the third interlayer insulating film 309. Note that the first contact holes are contact holes for connecting the wirings and the semiconductor layers.

Next, a first insulating film 402 made from a silicon oxide nitride film, a silicon nitride oxide film, a silicon nitride film, or the like is formed on the upper first light shielding film 401 by a plasma CVD method or the like.

Next, a portion of the first insulating film filled into the second contact holes is removed to expose the upper first light shielding film 401, and then an upper second light shielding film 403 is formed on the first insulating film 402. Note that, since the upper second light shielding film 403 is to be connected with a pixel electrode, it is formed by, for example, laminating a conductive film made of a material which prevents electrolytic corrosion by contact with an ITO film used as the pixel electrode. In this embodiment, a structure is used such that a conductive film including mainly aluminum is formed and then a conductive film including mainly tungsten is laminated in a pixel electrode contact side. The film thickness of the upper second light shielding film 403 is set to be 100 nm to 200 nm. Subsequently, a second insulating film 404 is formed on the upper second light shielding film 403 as in the case of the first insulating film.

Next, an upper third light shielding film 405 is formed on the second insulating film 404. Note that the upper third light shielding film is electrically connected with the lower light shielding film 301 or the upper first light shielding film 401 so as to provide the same potential (ground potential in this embodiment) as the lower light shielding film 301 and the upper first light shielding film 401. Note that a wiring is preferably connected therewith so as to provide a ground potential by connection in a region except for a pixel, in which a problem such as an aperture ratio is reduced by connection is not caused.

Next, third contact holes for electrically connecting a pixel electrode which is formed later and the upper second light shielding film 403 are formed. The lower light shielding film 301, the upper first light shielding film 401, the upper second light shielding film 403, and the upper third light shielding film 405 on the bottom surface of the window are removed.

Next, a fourth interlayer insulating film 406 is formed on the upper third light shielding film 405. Note that an insulating film which is formed by a plasma CVD method and selected from a silicon nitride film, a silicon oxide nitride film, a silicon nitride oxide film, and the like may be also used as the fourth interlayer insulating film 406 as in the cases of the first insulating film 402 and the second insulating film 404.

Next, leveling for the window is conducted. An organic insulating film made of acrylic or the like is preferably used as a leveling film 407 as in Embodiment 1. Also, as indicated in Embodiment 1, the window is filled with a photoresist film colored with R, G, or B and then leveling may be conducted using an organic resin film made of acrylic or the like.

Subsequently, a fifth interlayer insulating film 408 made from a silicon nitride film, a silicon oxide nitride film, a silicon nitride oxide film, or the like is formed on the entire surface by a sputtering method and a portion of the insulating film filled into the third contact holes is removed to expose the upper second light shielding film 403. Then, a pixel electrode 409 is formed so as not to be in contact with the upper second light shielding film 403. A transparent ITO film (compound of indium oxide and tin oxide) is formed as the pixel electrode 409 at a film thickness of 100 nm by a sputtering method.

By the above steps, a first storage capacitor 502 and a second storage capacitor 503 are formed along a side surface of the window. In the first storage capacitor 502, the upper first light shielding film 401 is one capacitor wiring, the first insulating film 402 is a dielectric, and the upper second light shielding film 403 is the other capacitor wiring. Also, in the second storage capacitor 503, the upper second light shielding film 403 is one capacitor wiring, the second insulating film 404 is a dielectric, and the upper third light shielding film 405 is the other capacitor wiring. Note that, although a sufficient capacitance is obtained by the first storage capacitor and the second storage capacitor, the storage capacitor composed of the semiconductor layer, the insulating film which is the same layer as the gate insulating film, and the capacitor wiring which is the same layer as the gate electrode, as in the Embodiment 1 may be formed together with these capacitors.

In order to further increase the capacitance of the storage capacitor element, a portion of the lower light shielding film formed on the bottom surface of the window is removed and then the exposed substrate is cut. Thus, the storage capacitor element may be extended to the inner portion of the substrate.

The wiring 308 and the upper second light shielding film 403 are connected with each other and the upper second light shielding film 403 and the pixel electrode 409 are connected with each other. Finally, the pixel electrode 409 and the wiring 308 are electrically connected with each other. Thus, a TFT 501 can be formed as a switching element of a pixel. Also, when the two-stage connection between the wiring and the pixel electrode via the upper light shielding film is made as in this embodiment, an aspect ratio of contact holes can be reduced. Thus, processing is easy and a preferable coverage can be obtained even when a sputtering method is used at film formation. Further, a contact resistance can be reduced as compared with the case where a contact hole is narrow and long. Furthermore, if the position of the contact hole for the pixel electrode (ITO) and the upper second light shielding film is shifted from that of the contact hole for the upper second light shielding film and the wiring, a light shielding property is improved and a problem that a leak current is caused by photo excitation can be solved.

As described above, when the plurality of upper light shielding films are formed to cover the TFT, the TFT can be completely shielded and the storage capacitor having a sufficient capacitance can be formed along the side surface of the window. Thus, an aperture ratio can be further increased.

Embodiment 3

In this embodiment, one example of an active matrix liquid-crystal display device manufactured using the active matrix substrate manufactured in Embodiment 1 or 2 will be described.

Figure 7:
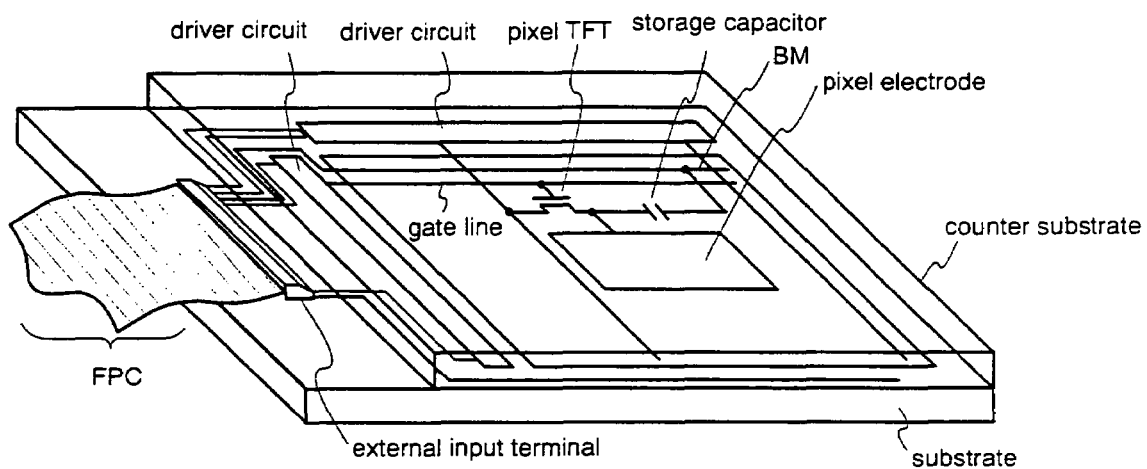
FIG. 7 shows one example in accordance with an embodiment of the present invention.

In FIG. 7, an active matrix substrate includes a pixel portion, driver circuits, and another signal processing circuit, which are formed on a substrate. A TFT (also called a pixel TFT) and a storage capacitor are formed in the pixel portion. The driver circuits formed in the vicinity of the pixel portion are fundamentally composed of CMOS circuits.

A gate line and a source line are formed to extend them from the driver circuits to the pixel portion and connected with the pixel TFT. An FPC (flexible printed circuit board) is connected with an external input terminal and used for inputting an image signal and the like to the driver circuits. Note that the FPC is strongly bonded through a reinforcement resin to the substrate and connected with the respective driver circuits through connection wirings. Although not shown, a counter electrode is formed in a counter substrate.

According to the active matrix liquid crystal display device formed by the present invention, the light shielding film is formed on the TFT to over it. Thus, the occurrence of a photo leak current by stray light can be suppressed, a potential of the pixel electrode is not varied, and a high quality display can be conducted.

Embodiment 4

Figure 13A:
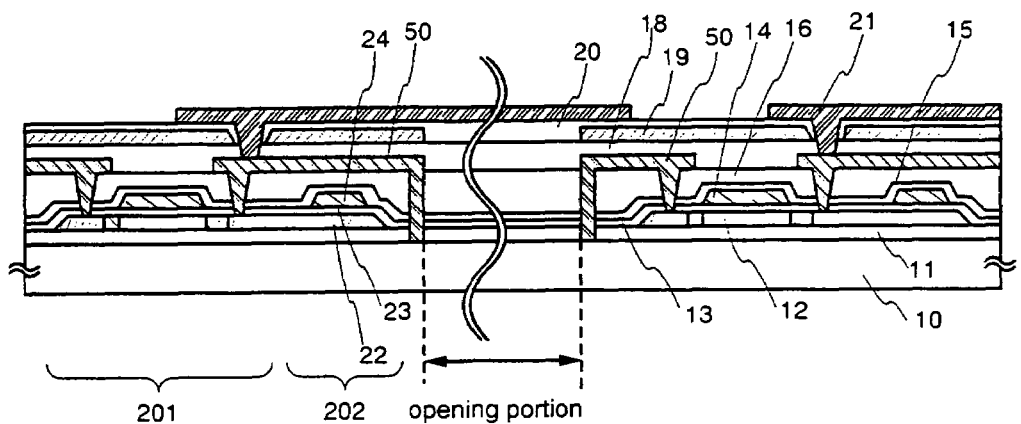
FIGS. 13A and 13B show examples in accordance with an embodiment of the present invention.

A pixel having another structure according to the present invention will be described with reference to FIGS. 13A and 13B.

In accordance with the steps in Embodiment 1, the steps until the second interlayer insulating film 16 is formed are performed. Subsequently, in the step of forming the first contact hole which reaches the semiconductor layer, grooves are formed in the boundary between a region through which light is transmitted and the TFT and wirings 50 for electrically connecting among the respective TFTs are formed. The wirings are continuously formed so as to fill the grooves therewith from a region over the second interlayer insulating film.

Subsequently, the third interlayer insulating film 18 is formed and the upper light shielding film 19 is formed. Then, a second contact hole for connecting a pixel electrode and the wiring are formed and the fourth interlayer insulating film 20 is formed. A portion of an insulating film filled into the second contact hole is removed to such an extent that the light shielding film is not in contact with the pixel electrode, and then the pixel electrode 21 is formed.

Figure 13B:
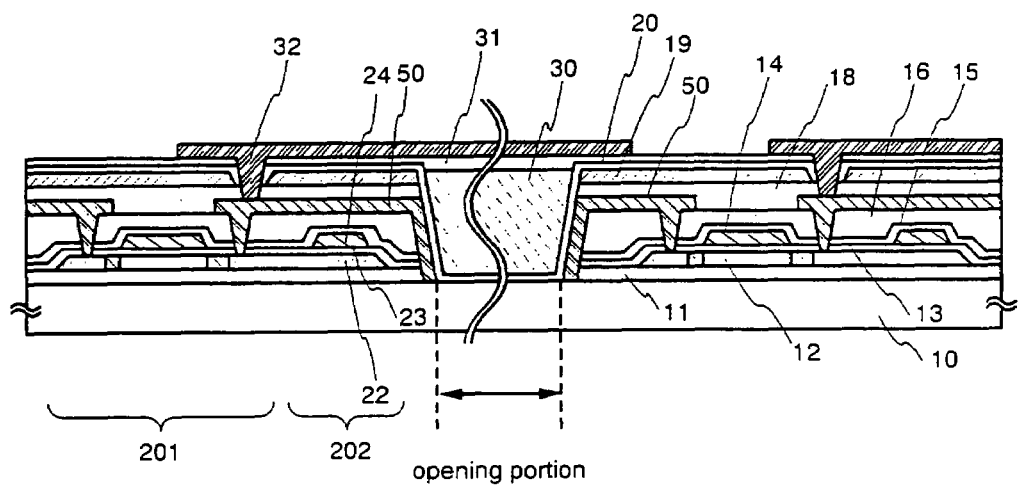

Another example is shown in FIG. 13B. In accordance with the steps in Embodiment 1, the steps until the second interlayer insulating film 16 is formed are performed. Subsequently, a contact hole which reaches a semiconductor layer is formed and the base insulating film 11, the gate insulating film 13, the first interlayer insulating film 15, and the second interlayer insulating film 16 in a region somewhat wider than an opening portion are removed to form a window.

Subsequently a wiring for electrically connecting among respective TFTs is formed. The wiring is continuously formed from a region located on the second interlayer insulating film 16 along the wall surface of the window. The wiring formed on the bottom surface of the window is removed, and then the third interlayer insulating film 18 is formed and the light shielding film 19 is formed. Next, the fourth interlayer insulating film 20 is formed, and then a leveling film 30 for the window is formed and the fifth interlayer insulating film 31 is formed. After that, a portion of an insulating film filled into a second contact hole is removed to such an extent that the light shielding film is not in contact with the pixel electrode, and then the pixel electrode 32 is formed.

As described above, even when the wiring and the light shielding film are used, the semiconductor layer of the TFT can be light-shielded.

Embodiment 5

In this embodiment, steps of forming a crystalline semiconductor layer will be described.

Figure 8A:
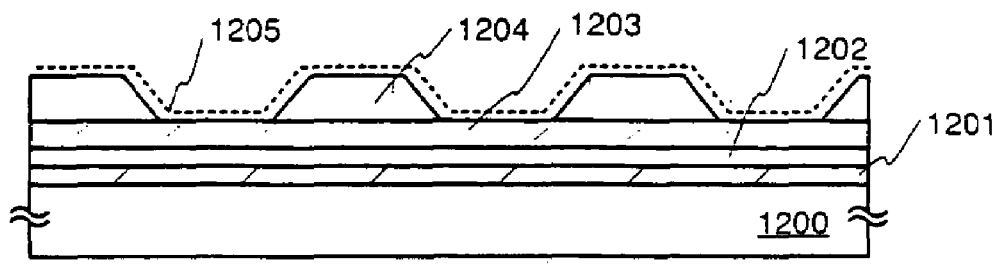
FIGS. 8A to 8D show one example in accordance with an embodiment of the present invention.

A lower light shielding film 1201 and a base insulating film 1202 are formed on a substrate 1200. Then, an amorphous silicon film 1203 is formed as an amorphous semiconductor film on the base insulating film 1202. Then, a mask, 1204 is formed on the amorphous silicon film 1203, a metallic element having a function for promoting crystallization (hereinafter referred to as a catalyst element) is added onto the amorphous silicon film exposed from opening portions of the mask to form a catalyst-containing layer 1205. A metallic element such as Ni, Fe. Co, Ru, Rh, Pd, Os, Pt, or Au can be used as the catalytic element. In this embodiment, nickel (Ni) is used as the catalytic element (FIG. 8A).

Figure 8B:
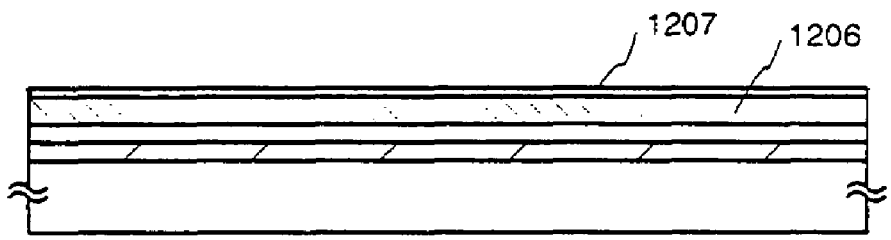
Figure 8C:
Figure 8D:
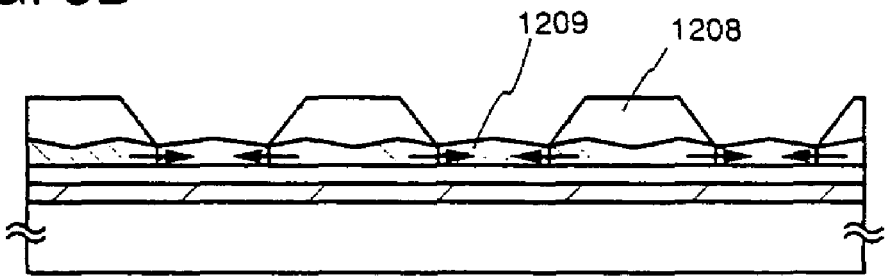

Subsequently, heat treatment is performed in a nitrogen atmosphere at 600° C. (500° C. to 700° C.) for 12 hours (4 hours to 12 hours) to form a crystalline silicon film 1206 (FIG. 8B) with an oxide film 1207. Note that, in order to reduce hydrogen included in the amorphous silicon film, heat treatment at 450° C. for 1 hour may be performed as pretreatment to the heat treatment for crystallization. Also, after the heat treatment for crystallization, laser light irradiation may be performed to improve the crystallinity of the crystalline silicon film (FIG. 8C).

Next, heat treatment for reducing a concentration of the catalytic element included in the crystalline silicon film is performed. Because it is considered that the catalytic element is segregated in a grain boundary of the silicon film and the segregation becomes a leak path of a very weak current, and thus an off current (current when a TFT is in an off state) is suddenly increased.

First, a mask 1208 is formed on the crystalline silicon film and an element belonging to group 15 of the periodic table (typically, phosphorus) is added to the crystalline silicon film. Gettering sites 1209 including phosphorus at a concentration of $1 \times 10^{19}/cm$ to $1 \times 10^{20}/cm^3$ are formed in the crystalline silicon film exposed from the mask opening portions. Note that regions to which the element belonging to group 15 of the periodic table is added and the catalytic element is moved by the heat treatment in this specification is called the gettering sites.

Next, heat treatment is performed in a nitrogen atmosphere at 450° C. to 650° C. for 4 hours to 12 hours. The catalytic element in the crystalline silicon film is moved to the gettering sites by the heat treatment. Thus, the concentration of the catalytic element in the crystalline silicon film can be reduced to be $1 \times 10^{17}/cm^3$ or lower, preferably, $1 \times 10^{16}/cm^3$ or lower.

Therefore, the crystalline silicon film obtained using the catalytic element has a crystal structure in which rod-shaped crystal or a column-shaped crystal is oriented with a specific directional property and the crystallinity is very high. When such a semiconductor layer is used, a TFT having a preferable characteristic can be manufactured. Note that this embodiment can be used by being combined with Embodiments 1 and 2.

Embodiment 6

In this embodiment, a manufacturing step of crystalline semiconductor layer is described.

Figure 9A:
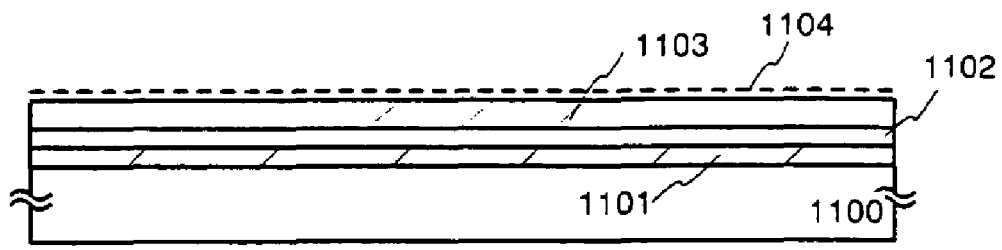
FIGS. 9A to 9D show one example in accordance with the embodiment of the present invention.

A lower light shielding film 1101 and a ground insulating film 1102 are formed on the substrate 1100. Next, an amorphous silicon film 1103 is formed to 200 nm thick on the ground insulating film 1102. Then, a catalyst element is added to the amorphous silicon film. In this embodiment, nickel is used as a catalyst element and an aqueous solution containing Ni (10 ppm by weight) (aqueous solution of nickel acetate) is applied to the film by a spin-coating method to form a catalyst element content layer 1104. Sputtering and evaporation may be used other than spin-coating in adding a catalyst element. (FIG. 9A)

Figure 9B:
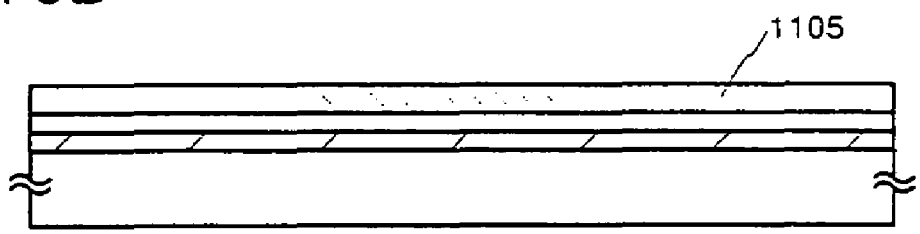
Figure 9C:
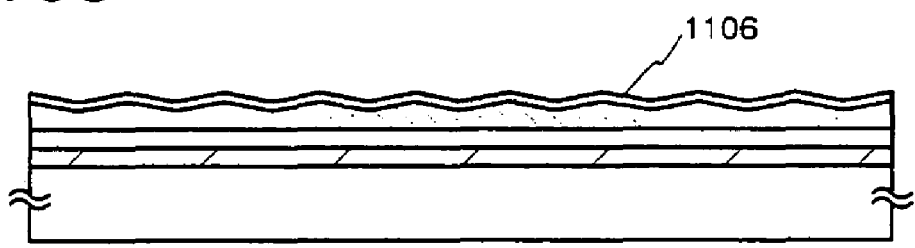
Figure 9D:
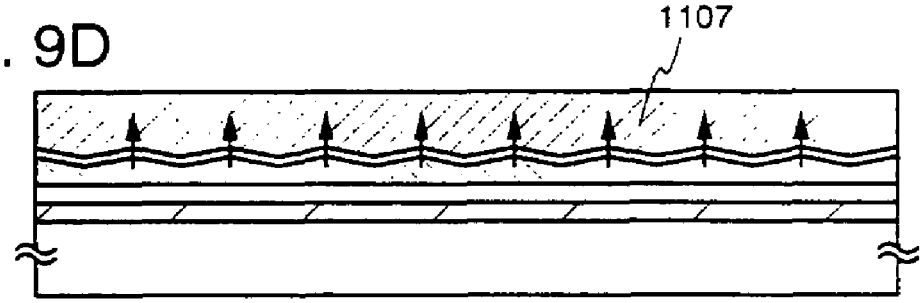

Next, prior to a crystallizing step, a heating process is carried out for around one hour at 400 to 500° C. to eliminate hydrogen from the film, and then, another heating process is carried out for 4 to 12 hours at 500 to 650° C. to perform a process for crystallizing the semiconductor film so that a crystal silicon film 1105 would be formed. (FIG. 9B) In addition, laser light can be irradiated to improve a crystallinity. (FIG. 9C)

A step for reducing the concentration of a catalyst element remaining on, the crystal silicon film 1105 is carried out. It is assumed that the crystal silicon film 1105 contains a catalyst element at the concentration of $1 \times 10^{19} cm^3$ or more. It is possible to use the crystal silicon film 1105 on which the catalyst element remains to manufacture a TFT, but in this case, there is a problem that the catalyst element is segregated in a defect of a semiconductor layer and an OFF-state current unexpectedly rises. Accordingly, a heating process is carried out for the purpose of eliminating the catalyst element from the crystal silicon film 1105 SO that the concentration would be reduced to $1 \times 10^{17}/cm^3$ or less, preferably $1 \times 10^{16}/cm^3$ or less.

A barrier layer 1106 is formed on the surface of the crystal silicon film 1 105. The barrier layer 1106 is provided so that the crystal silicon film 1105 would not be etched in eliminating by etching a gettering site 1107 provided later on the barrier layer 1106.

The thickness of the barrier layer 1106 is around 1 to 10 nm, and the barrier layer 1106 may be easily a chemical oxide formed by processing the crystal silicon film with ozone water. In another example, the chemical oxide can be formed similarly by means of a solution in which sulfuric acid, hydrochloride acid or nitric acid is mixed with a solution of hydrogen peroxide. In another example, the barrier layer may be formed by carrying out a plasma process in an oxide atmosphere or ultraviolet rays radiation in an oxygen content atmosphere so that ozone would be generated to perform an oxidation process. Further, in another example, the barrier layer can be formed by a thin oxide film, which is formed by heating at 200 to 350° C. in a clean oven.

Next, the gettering site 1107 is formed on the barrier layer 1106 by sputtering. The gettering site 1107 is formed by means of a semiconductor film containing diluted gas at the concentration of $1 \times 10^{20}/cm^3$ or more, represented by an amorphous silicon film, which is 25 to 250 nm in thickness. The gettering site 1107 has preferably a low density so that a selecting rate of etching to the crystal silicon film 1105 would be large since the gettering site 1107 is eliminated by etching after the gettering step is completed.

The gettering site 1107 is formed by sputtering under a condition that Ar is 50 sccm, film forming power is 3 kW, temperature of a substrate is 150° C. and film forming pressure is 0.2 to 1.0 Pa. In accordance with the above process, the gettering site 1107 containing a diluted gas element at the concentration of $1 \times 10^{19}$ to $1 \times 10^{22}/cm^3$ can be formed. The diluted gas element does not badly influence the crystal silicon film 1105 since it is inert in a semiconductor film, and therefore, the gettering can be performed.

A heating process for ensuring completion of gettering is carried out following to the above. The heating process may be performed by a method for heating by means of a furnace or an RTA method in which a lamp or heated Ras is used as a heat source. In the case of using a furnace, the heating process should be performed in a nitrogen atmosphere at 450 to 600° C. for 0.5 to 12 hours. In the case of the RTA method, a semiconductor film should be heated to around 600 to 1000° C. at a moment.

The catalyst element remaining on the crystal silicon film 1105 is transported to the gettering site 1107 in such heating process, so that the concentration of the catalyst element on the crystal silicon film 1105 can be reduced to $1 \times 10^{17}/cm^3$ or less, preferably $1 \times 10^{16}/cm^3$ or less. The gettering site 1107 is not crystallized in the heating process for gettering. It may be because the diluted gas element is not effused and remains in the gettering site even during the heating process.

The getting site 1107 is eliminated by etching after the gettering process is completed. Dry etching by means of $CIF_3$ in which plasma is not used or wet etching in which an alkaline solution such as a solution containing hydrazine or tetraethyl ammonium hydroxide $((CH_3)_4NOH)$ is used can be carried out for the above-mentioned etching. In this etching step, the barrier layer 1106 works as an etching stopper for preventing the crystal silicon film 1105 from being etched. The barrier 1106 can be eliminated by means of hydrofluoric acid after the elimination of the gettering site 1107 by etching is completed.

Thus, the crystal silicon film 1105 has a crystal structure in which cylinder shape or columnar shape crystals are lined up with a specific directionality and have a good crystallinity. Further, the concentration of the catalytic element remaining in the crystal silicon film can be reduced enough. Using such semiconductor film, a good characteristic TFT can be formed. This embodiment can be implemented by freely combined with Embodiments 1 and 2.

Embodiment 7

Figure 16A:
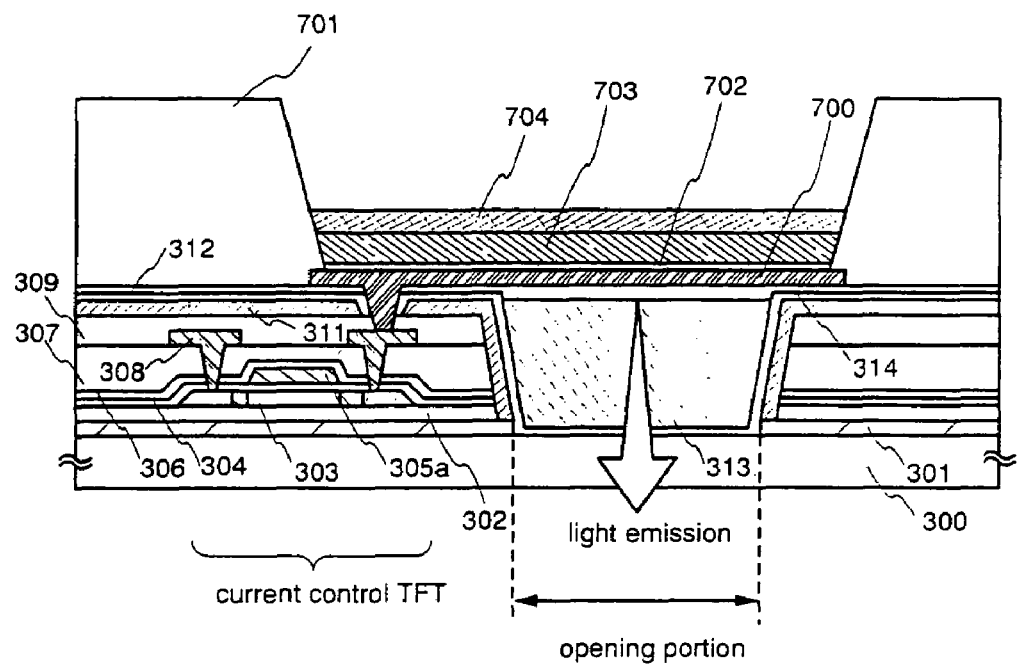
FIGS. 16A and 16B show examples in accordance with an embodiment of the present invention.

A method of manufacturing a light emitting device by forming a film including an organic compound (which is called an organic compound layer) in which light emission is produced by applying an electric field thereto and a cathode on the pixel electrode in the TFT substrate according to the present invention will be described by using FIGS. 16A and 16B.

Based on Embodiment 1, a TFT for controlling a current flowing into a light emitting element (laminate composed of an anode, an organic compound layer, and a cathode) (current control TFT) is formed on a substrate, a window 310 is formed, and the upper light shielding film 311 and the insulating film 312 are formed. Then, leveling is conducted by filling the window 310 with the organic insulating film 313. Note that a p-channel TFT is preferably applied to the current control TFT in this embodiment.

Then, a step between the insulating film 312 and the organic insulating film 313 is reduced for leveling by using the fourth interlayer insulating film 314, and then a pixel electrode (which is also called the anode) 700 is formed to obtain the state as shown in FIG. 3B. Note that the step between the insulating film 312 and the organic insulating film 313 is not necessarily reduced for leveling. Thus, leveling is conducted as appropriate by a manufacturer if necessary. Next, after the pixel electrode (anode) 700 is formed, a bank 701 made from an organic resin film is formed to cover end portions of the anode 700. When the organic resin film is formed, since there is no case where the organic compound layer is formed in the end portion of the anode, the concentration of an electric field to the organic compound layer can be prevented. Next, the organic resin film formed in a region through which light is transmitted is removed to expose the anode 700, an insulating film 702 is formed on the anode 700, and an organic compound layer 703 and a cathode 704 are formed on the insulating film.

An organic resin film made of polyimide, polyamide, polyimide amide, or the like is preferably formed as the insulating film 702 at a film thickness of 1 nm to 5 nm by a spin coat method, an evaporation method, a sputtering method, or the like.

The organic compound layer 703 is preferably formed by laminating a plurality of layers such as a hole injection layer, a hole transport layer, a hole blocking layer, an electron transport layer, an electron injection layer, and a buffer layer in combination in addition to a light emitting layer. It is preferable that the film thickness of the organic compound layer 703 is about 10 nm to 400 nm.

The cathode 704 is formed by an evaporation method after the formation of the organic compound layer 703. In addition to MgAg or an Al—Li alloy (alloy of aluminum and lithium), a film formed by coevaporation of an element belonging to group 1 or 2 of the periodic table and aluminum may be used for the cathode 704. Note that the film thickness of the cathode 704 is preferably about 80 nm to 200 nm. Thus, a light emitting device as shown in FIG. 16A can be manufactured.

Figure 16B:
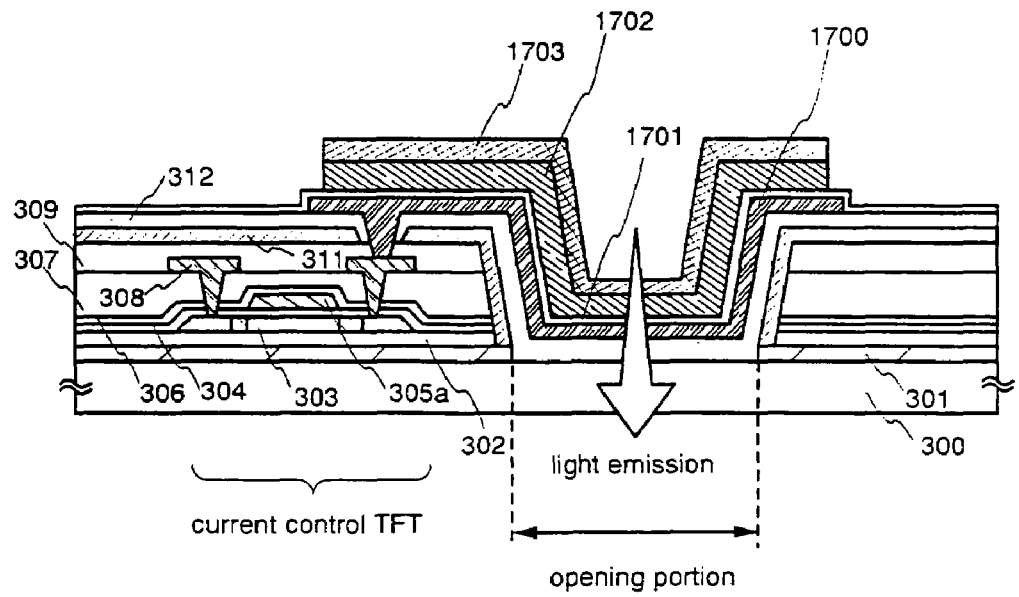

Note that, after the insulating film 312 is formed based on Embodiment 1, an anode 1700, an insulating film 1701, an organic compound layer 1702, and a cathode 1703 can be also formed in the inner portion of the window as shown in FIG. 16B without leveling for the window 310. Therefore, since it is unnecessary to form the bank for preventing the formation of the organic compound layer in the end portions of the anode, a manufacturing cost can be reduced.

Also, when a glass substrate in a region corresponding to the opening portion formed in the window 310 is cut out to be thinner than other regions, a light emitting region of the light emitting element is expanded. Thus, the brightness in the light emitting device can be also increased.

Thus, an application area of the present invention is wide and the present invention can be also applied to a device except a liquid crystal display device. Note that a light emitting device can be manufactured by combining this embodiment with Embodiment Modes 1 to 3 and Embodiments 1, 2 and 4 to 6.

Embodiment 8

Electronic equipments, which can display high luminance and high quality image, can be realized by incorporating active matrix type liquid crystal display device (liquid crystal display device or EL display device) by implementing the present invention.

As such electronic apparatus, there are pointed out a projector, a video camera, a digital camera, a head mount display (goggle type display), a personal computer, a portable information terminal (mobile computer, portable telephone or electronic book) and the like. Examples of these are shown in FIGS. 10A–10D, 11A–11F and 12A–12C.

Figure 10A:
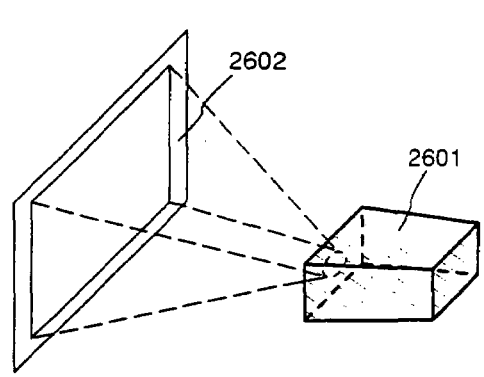
FIGS. 10A to 10D show one example of an electrical appliance.

FIG. 10A shows a front type projector including a projection apparatus 2601 and a screen 2602.

Figure 10B:
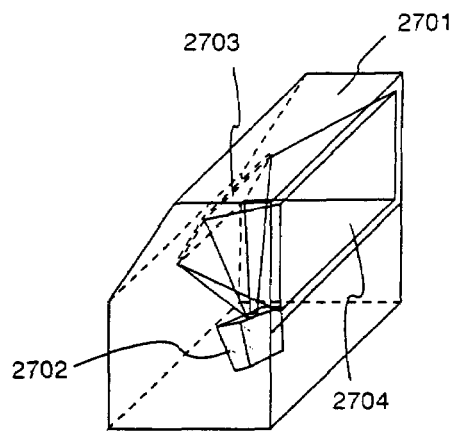

FIG. 10B shows a rear type projector including a main body 2701, a projection apparatus 2702, a mirror 2703 and a screen 2704.

Figure 10C:
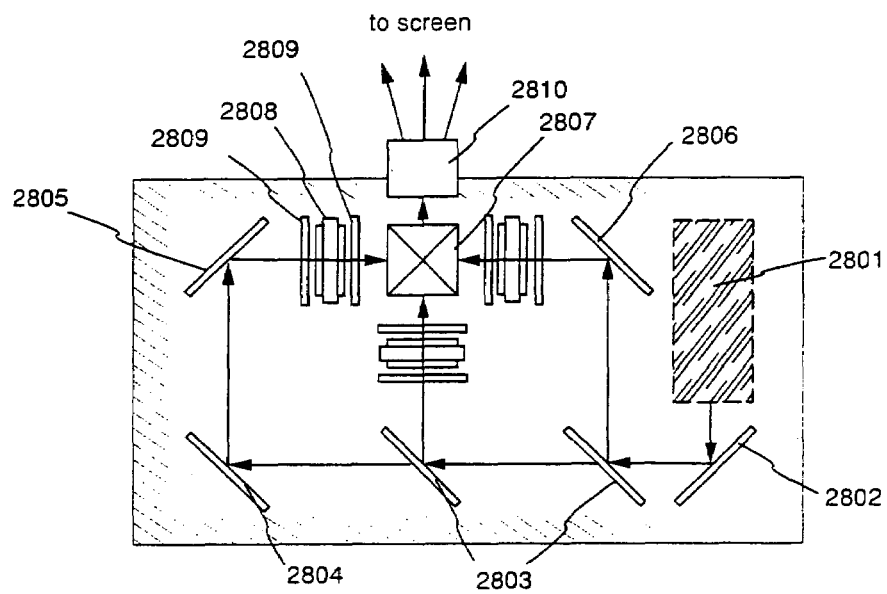

Further, FIG. 10C is a view showing an example of a structure of the projection apparatus 2601 and 2702 in FIG. 10A and FIG. 10B. The projection apparatus 2601 or 2702 is constituted by a light source optical system 2801, mirrors 2802, 2804–2806, a dichroic mirror 2803, a prism 2807, a liquid crystal display apparatus 2808, a phase difference plate 2809 and a projection optical system 2810. The projection optical system 2810 is constituted by an optical system including a projection lens. Although the embodiment shows an example of three plates type, the embodiment is not particularly limited thereto but may be of, for example, a single plate type. Further, person of executing the embodiment may pertinently provide an optical system such as an optical lens, a film having a polarization function, a film for adjusting a phase difference or an IR film in an optical path shown by arrow marks in FIG. 10C.

Figure 10D:
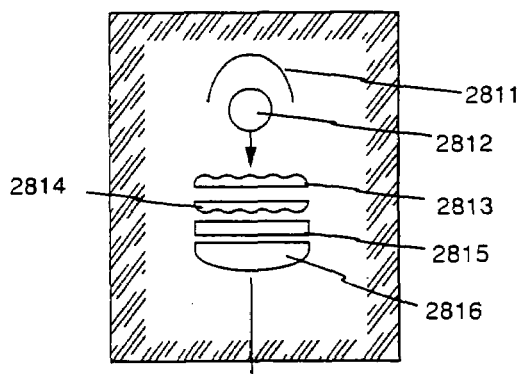

Further, FIG. 10D is a view showing an example of a structure of the light source optical system 2801 in FIG. 10C. According to the embodiment, the light source optical system 2801 is constituted by a reflector 2811, a light source 2812, lens arrays 2813 and 2814, a polarization conversion element 2815 and a focusing lens 2816. Further, the light source optical system shown in FIG. 10D is only an example and the embodiment is not particularly limited thereto. For example, a person of executing the embodiment may pertinently provide an optical system such as an optical lens, a film having a polarization function, a film for adjusting a phase difference or an IR film in the light source optical system.

FIG. 11A shows a personal computer including a main body 2001, an image input portion 2002, a display portion 2003 and a keyboard 2004.

FIG. 11B shows a video camera including a main body 2101, a display portion 2102, a voice input portion 2103, operation switches 2104, a battery 2105 and an image receiving portion 2106.

FIG. 11C shows a mobile computer including a main body 2201, a camera portion 2202, an image receiving portion 2203, an operation switch 2204 and a display portion 2205.

FIG. 11D shows a goggle type display including a main body 2301, a display portion 2302 and an arm portion 2303.

FIG. 11E shows a player using a record medium recorded with programs (hereinafter, referred to as record medium) including a main body 2401, a display portion 2402, a speaker portion 2403, a record medium 2404 and an operation switch 2405. The player uses DVD (digital Versatile Disc) or CD as the record medium and can enjoy music, enjoy movie and carry out game or Internet.

FIG. 11F shows a digital camera including a main body 2501, a display portion 2502, an eye contact portion 2503, operation switches 2504 and an image receiving portion (not illustrated).

Figure 12A:
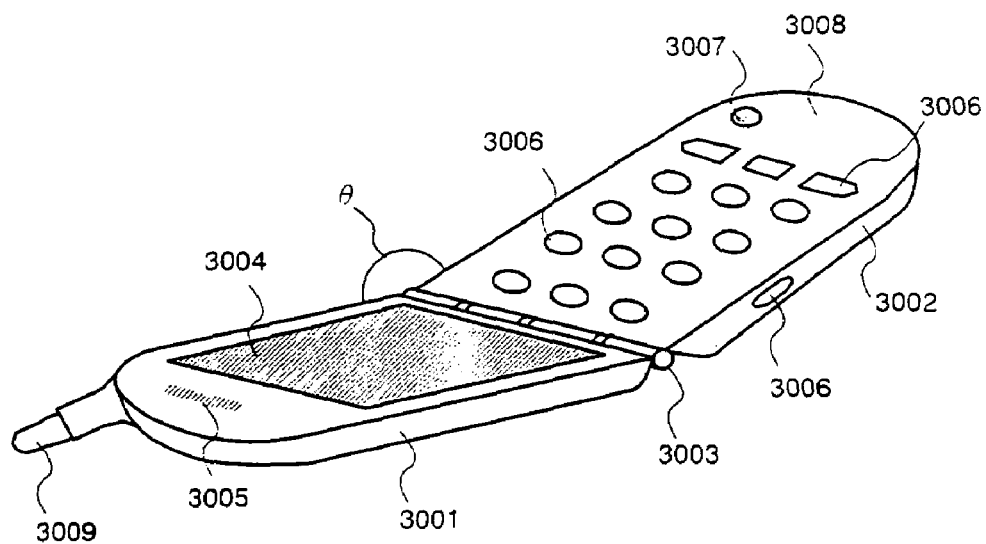
FIGS. 12A to 12C show examples of electrical appliances.

FIG. 12A shows a portable telephone including a display panel 3001, an operation panel 3002. The display panel 3001 and the operation panel 3002 are connected to each other in the connecting portion 3003. In the connecting panel 3003, the angle θ of a face, which is provided the display portion 3004 of the display panel 3001, and a face, which is provided the operation key 3006 of the operation panel 3002, can be changed arbitrary. Further, a voice output portion 3005, an operation key 3006, a power source switch 3007 and a sound input portion 3008 are also included.

Figure 12B:
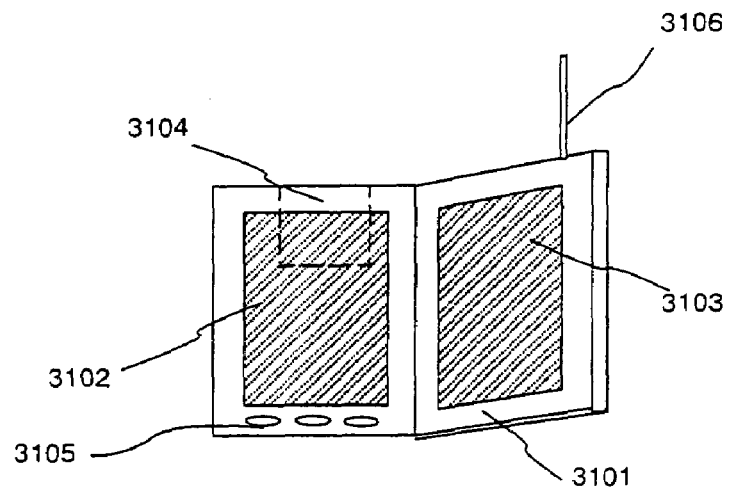

FIG. 12B shows a portable book (electronic book) including a main body 3101, display portions 3102 and 3103, a record medium 3104, an operation switch 3105 and an antenna 3106.

Figure 12C:
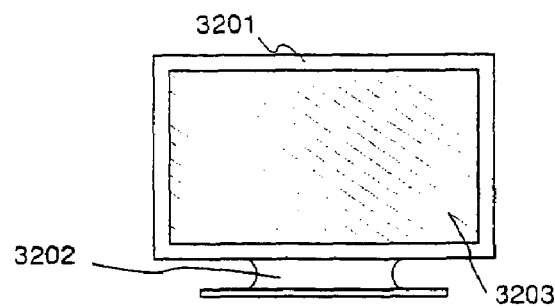

FIG. 12C shows a display including a main body 3201, a support base 3202 and a display portion 3203.

As has been described, the range of applying the invention is extremely wide and is applicable to electronic apparatus of all the fields. The electronic apparatus of the present invention can be implemented by freely combined with Embodiments 1 to 4.

According to the present invention, when the light shielding film is formed to cover the TFT, the TFT can be completely covered with the lower light shielding film and the upper light shielding film. Thus, a photo leak current can be suppressed. Also, a sufficient capacitance can be obtained without reducing an aperture ratio.

When such a light shielding technique of the TFT is used, a display device capable of displaying an image at a high quality, high definition, and high brightness can be realized. Also, when such a display device is used for a display unit of an electrical appliance, an electrical appliance capable of displaying an image at a high quality, high definition, and high brightness can be realized.

The invention claimed is:

1. A light emitting device comprising:
    a thin film transistor formed over a substrate, the thin film transistor having at least a semiconductor layer and a gate electrode with a gate insulating film interposed therebetween;
    a first insulating film formed over the thin film transistor;
    a second insulating film formed over the first insulating film and inside an opening portion formed by removing a portion of the first insulating film;
    a pair of wirings electrically connected to the semiconductor layer; and
    an organic compound layer formed between an anode and a cathode, wherein a portion of the
    organic compound layer is formed inside the opening portion.

2. A light emitting device according to claim 1, wherein the anode is in contact with one of the pair of the wirings.

3. A light emitting device according to claim 1, wherein the cathode comprises at least one of MgAg and Al—Li alloy.

4. A light emitting device according to claim 1, further comprising an insulating film between the anode and the organic compound layer.

5. A light emitting device according to claim 1, wherein the light emitting device is an EL display device.

6. A light emitting device according to claim 1, wherein the light emitting device is incorporated in at least one selected from the group consisting of a projector, a personal computer, a video camera, a mobile computer, a goggle type display, a player using a record medium, a digital camera, a portable telephone, and a portable electronic book.

7. A light emitting device comprising:
    a thin film transistor formed over a substrate, the thin film transistor having at least a semiconductor layer and a gate electrode with a gate insulating film interposed therebetween;

a first insulating film formed over the thin film transistor;
a second insulating film formed over the first insulating film and inside an opening portion formed by removing a portion of the first insulating film, wherein a side wall of the opening portion has a tapered cross section;
a pair of wirings electrically connected to the semiconductor layer; and
an organic compound layer formed between an anode and a cathode, wherein a portion of the organic compound layer is formed inside the opening portion.

8. A light emitting device according to claim 7, wherein the anode is in contact with one of the pair of the wirings.

9. A light emitting device according to claim 7, wherein the cathode comprises at least one of MgAg and Al—Li alloy.

10. A light emitting device according to claim 7, further comprising an insulating film between the anode and the organic compound layer.

11. A light emitting device according to claim 7, wherein the light emitting device is an EL display device.

12. A light emitting device according to claim 7, wherein the light emitting device is incorporated in at least one selected from the group consisting of a projector, a personal computer, a video camera, a mobile computer, a goggle type display, a player using a record medium, a digital camera, a portable telephone, and a portable electronic book.

13. A light emitting device comprising:
a thin film transistor formed over a substrate, the thin film transistor having at least a semiconductor layer and a gate electrode with a gate insulating film interposed therebetween;
a first insulating film formed over the thin film transistor;
a second insulating film formed over the first insulating film, and inside an opening portion formed by removing a portion of the first insulating film, wherein a side wall of the opening portion has a tapered cross section, and wherein a portion of the second insulating film is in contact with the substrate;
a pair of wirings electrically connected to the semiconductor layer; and
an organic compound layer formed between an anode and a cathode, wherein a portion of the organic compound layer is formed inside the opening portion.

14. A light emitting device according to claim 13, wherein the anode is in contact with one of the pair of the wirings.

15. A light emitting device according to claim 13, wherein the cathode comprises at least one of MgAg and Al—Li alloy.

16. A light emitting device according to claim 13, further comprising an insulating film between the anode and the organic compound layer.

17. A light emitting device according to claim 13, wherein the light emitting device is an EL display device.

18. A light emitting device according to claim 13, wherein the light emitting device is incorporated in at least one selected from the group consisting of a projector, a personal computer, a video camera, a mobile computer, a goggle type display, a player using a record medium, a digital camera, a portable telephone, and a portable electronic book.

19. A light emitting device comprising:
a thin film transistor formed over a substrate, the thin film transistor having at least a semiconductor layer and a gate electrode with a gate insulating film interposed therebetween;
a first insulating film formed over the thin film transistor;
a second insulating film formed over the first insulating film and inside an opening portion formed by removing a portion of the first insulating film, wherein the opening portion is formed adjacent to a substrate with the second insulating layer interposed therebetween; and
an organic compound layer formed between an anode and a cathode, wherein a portion of the organic compound layer is formed inside the opening portion.

20. A light emitting device according to claim 19, wherein the cathode comprises at least one of MgAg and Al—Li alloy.

21. A light emitting device according to claim 19, further comprising an insulating film between the anode and the organic compound layer.

22. A light emitting device according to claim 19, wherein the light emitting device is an EL display device.

23. A light emitting device according to claim 19, wherein the light emitting device is incorporated in at least one selected from the group consisting of a projector, a personal computer, a video camera, a mobile computer, a goggle type display, a player using a record medium, a digital camera, a portable telephone, and a portable electronic book.

24. A light emitting device comprising:
a thin film transistor formed over a substrate, the thin film transistor having at least a semiconductor layer and a gate electrode with a gate insulating film interposed therebetween;
a first insulating film formed over the thin film transistor;
a second insulating film formed over the first insulating film and inside an opening portion formed by removing a portion of the first insulating film, wherein a portion of the second insulating film is in contact with the substrate; and
an organic compound layer formed between an anode and a cathode, wherein a portion of the organic compound layer is formed inside the opening portion.

25. A light emitting device according to claim 24, wherein the cathode comprises at least one of MgAg and Al—Li alloy.

26. A light emitting device according to claim 24, further comprising an insulating film between the anode and the organic compound layer.

27. A light emitting device according to claim 24, wherein the light emitting device is an EL display device.

28. A light emitting device according to claim 24, wherein the light emitting device is incorporated in at least one selected from the group consisting of a projector, a personal computer, a video camera, a mobile computer, a goggle type display, a player using a record medium, a digital camera, a portable telephone, and a portable electronic book.

* * * * *